(12) United States Patent
Chang et al.

(10) Patent No.: US 11,235,307 B2
(45) Date of Patent: Feb. 1, 2022

(54) FILTRATION SYSTEM AND METHOD FOR TREATING WATER CONTAINING NITROGEN AND PHOSPHOROUS COMPOUNDS

(71) Applicant: University of Central Florida Research Foundation, Inc., Orlando, FL (US)

(72) Inventors: Ni-Bin Chang, Orlando, FL (US); Martin P. Wanielista, Orlando, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 0 days.

(21) Appl. No.: 17/302,895

(22) Filed: May 14, 2021

(65) Prior Publication Data

US 2021/0354109 A1 Nov. 18, 2021

Related U.S. Application Data

(60) Provisional application No. 63/025,677, filed on May 15, 2020.

(51) Int. Cl.
*C02F 1/28* (2006.01)
*C02F 1/70* (2006.01)
(Continued)

(52) U.S. Cl.
CPC ..... *B01J 20/28016* (2013.01); *B01J 20/0229* (2013.01); *B01J 20/0248* (2013.01);
(Continued)

(58) Field of Classification Search
CPC ........ B01J 20/28016; B01J 20/0229; B01J 20/261; B01J 20/103; B01J 20/12;
(Continued)

(56) References Cited

U.S. PATENT DOCUMENTS 10,696,567 B2   6/2020   Chang et al.
10,787,373 B2   9/2020   Chang et al.
(Continued)

OTHER PUBLICATIONS

Ayoub et al., Iron and aluminum hydroxy (oxide) coated filter media for low-concentration phosphorus removal. Water Environment Research. 2001. Volume 73 (No. 4): 478.
(Continued)

*Primary Examiner* — Matthew O Savage
(74) *Attorney, Agent, or Firm* — Smith & Hopen, P.A.; Paul Murty

(57) ABSTRACT

A synergistic composition can be used to treat water containing nitrogen compounds and phosphorus compounds. The synergistic composition includes iron filings, clay particles, aluminum particles, and sand particles. The iron filings, clay particles, and aluminum particles act synergistically to remove nitrogen compounds and phosphorus compounds from water. Specifically, the clay particles attract the nitrogen compounds and the phosphorus compounds to be absorbed onto a surface of the iron filings and the clay particles. The aluminum particles react with the nitrogen compounds via an oxidation reaction to form ammonia compounds, and react with the phosphorus compounds to produce aluminum phosphate. As such, the synergistic relationship between the iron filings, clay particles, and aluminum particles remove nitrogen and phosphorus compounds from water and recover the compounds in usable forms, namely, ammonia and aluminum phosphate.

20 Claims, 17 Drawing Sheets
(3 of 17 Drawing Sheet(s) Filed in Color)

(51) Int. Cl.
*B01J 20/28* (2006.01)
*B01J 20/12* (2006.01)
*B01J 20/02* (2006.01)
*B01J 20/10* (2006.01)
*B01J 20/26* (2006.01)
*C02F 1/72* (2006.01)
*C02F 1/52* (2006.01)
*C02F 103/06* (2006.01)
*C02F 101/16* (2006.01)
*C02F 101/10* (2006.01)
*C02F 103/00* (2006.01)

(52) U.S. Cl.
CPC ............. *B01J 20/103* (2013.01); *B01J 20/12* (2013.01); *B01J 20/261* (2013.01); *C02F 1/288* (2013.01); *C02F 1/5245* (2013.01); *C02F 1/705* (2013.01); *C02F 1/72* (2013.01); *C02F 1/281* (2013.01); *C02F 1/285* (2013.01); *C02F 2101/105* (2013.01); *C02F 2101/16* (2013.01); *C02F 2101/163* (2013.01); *C02F 2103/001* (2013.01); *C02F 2103/06* (2013.01)

(58) Field of Classification Search
CPC ..... B01J 20/0248; C02F 1/288; C02F 1/5245; C02F 1/72; C02F 2103/06; C02F 1/281; C02F 1/285; C02F 2101/105; C02F 2103/001; C02F 2101/16; C02F 1/705; C02F 2101/163
See application file for complete search history.

(56) References Cited

U.S. PATENT DOCUMENTS 10,947,131 B2   3/2021  Chang et al.
2006/0249465 A1*  11/2006  Jin .......................... C02F 1/281
                                                          210/764

OTHER PUBLICATIONS

Chang et al., Final Report: Bio-sorption Activated Media for Nitrogen Removal in a Rapid Infiltration Basin-Monitoring Project. FDEP. 2018. Project Agreement No. NS 003: 1-85.

Erickson et al., Capturing phosphates with iron enhanced sand filtration. Water Research. 2012. Volume 46: 3032-3042.

Reddy et al., Phosphorus Adsorption-Desorption Characteristics of Two Soils Utilized for Disposal of Animal Wastes. Journal of Environmental Quality. 1980. vol. 9 (No. 1):a 86-92.

Valencia et al., Optimal Recipe Assessment of Iron Filing-Based Green Environmental Media for Improving Nutrient Removal in Stormwater Runoff. Environmental Engineering Science. 2019. Volume 36 (No. 10): 1-14.

Valencia et al., Chemophysical Evaluation of Green Sorption Media for Copper Removal in Stormwater Runoff for Improving Ecosystem and Human Health. Water Air Soil Pollut. 2019. Volume 230:2.

Wen et al., Comparative copper toxicity impact and enzymatic cascade effect on Biosorption Activated Media and woodchips for nutrient removal in stormwater treatment. Chemosphere. 2018. Volume 213: 403-413.

O'Reilly et al., Nutrient removal using biosorption activated media: Preliminary biogeochemical assessment of an innovative stormwater infiltration basin. Science of the Total Environment. 2012. Volume 432. 227-242.

* cited by examiner

FILTRATION SYSTEM AND METHOD FOR TREATING WATER CONTAINING NITROGEN AND PHOSPHOROUS COMPOUNDS

CROSS-REFERENCE TO RELATED APPLICATIONS

This nonprovisional application is a continuation of and claims priority to provisional application No. 63/025,677, entitled "Synergistic aluminum-based green sorption media for nutrient removal and recovery," filed May 15, 2020, by the same inventors.

FEDERALLY SPONSORED RESEARCH OR DEVELOPMENT

This invention was made with Government support under ICER 1830036 awarded by the National Science Foundation and U.S. Department of Transportation Federal Aid No. HR01-055 as awarded by the Florida Department of Transportation. The government has certain rights in the invention.

BACKGROUND OF THE INVENTION

1. Field of the Invention

This invention relates, generally, to media used to improve efficiencies of nutrient removal and recovery. More specifically, it relates to synergistic functionalities between aluminum and iron particles as well as interactions with clay minerals that improve nutrient removal and recovery potential in aluminum-based green environmental media (AGEM).

2. Brief Description of the Prior Art

The nitrogen (N) and phosphorus (P) cycles are essential for the survival of plants and animals in an ecosystem. As a result, fertilizer application is commonly employed to enhance crop and plant cultivation. Nitrate uptake is responsible for leaf growth in plants, and ammonia is primarily utilized by plant roots, with both nutrients used for plant nutrition (Hachiya and Sakakibara, 2016). Phosphorus promotes seed formation (Sharma et al., 2013), and root growth is a limiting factor in crop production (Ramaekers et al. 2010). However, applied nitrogen fertilizer is not used efficiently by crops (Plett et al. 2018). Thus, human impact has significantly affected the natural operation of such cycles, affecting the integrity of ecosystems (Caraco 1993, Vitousek et al. 1997). Some examples include eutrophication, hypoxia, and the appearance of algal blooms in water systems, which are produced by an excess quantity of nutrients (Le et al. 2010, Huang et al. 2017). High quantities of N and P can also affect human health; for example, excessive exposure to N has been linked to respiratory disorders and cardiac disease (Townsend et al. 2003). In addition, excessive intake of P in humans can contribute to cardiovascular disease and impair kidney functions (Uribarri and Calvo 2013).

Stormwater runoff, agricultural discharge, and wastewater effluent are the main contributors to the surplus quantity of nutrients ending up in various receiving water bodies. Stormwater runoff carries pollutants from roofs, highways, pavements, lawns, and construction sites (Mikkelsen et al. 1997). Stormwater runoff concentration of total nitrogen (TN) and total phosphorus (TP) normally ranges from 0.01-1.97 mg·L$^{-1}$ of TN, and 0.14-2.78 mg·L$^{-1}$ of P, respectively (Yang and Toor 2017). N concentration in stormwater has been found as high as 10 mg·L$^{-1}$, depending on the watershed conditions and the concentration of the reused water. Moreover, the nutrient concentrations of reclaimed wastewater are highly dependent on the applied wastewater treatment process. Reclaimed wastewater is usually used to irrigate public parks, lawns, and agricultural crops (Caraco 1993), and its concentration normally ranges from 0.13-29.0 mg·L$^{-1}$ for N, and 0.02-6.0 mg·L$^{-1}$ for P (Badruzzaman et al. 2012).

As a result, best management practices (BMPs) have been widely implemented to treat stormwater runoff and agricultural discharge (Urbonas and Stahre 1993). Some BMPs involve employing green sorption media to help remove nutrients in stormwater runoff. The materials utilized for the development of media mixes are intended to be cost-effective and sustainable due to their use of recyclable materials, and renewable in terms of possible nutrient recovery. The study of filtration media for treating nutrient laden stormwater and wastewater has expanded to utilize other recycled materials such as metal aggregates because of their nutrient removal and recovery potential that is critical for the technology integration in a food-water nexus applicable for urban farming sites. The experimental process for capturing phosphates with iron-enhanced sand filtration was conducted by Erickson et al. (2012), who showed that incorporating iron filings into a sand filter to capture phosphates in column experiments has a significant effect on the hydraulic conductivity of the filter, as long as the mixture of iron filings is 5% or less iron by weight. Reddy et al. (2014) compared calcite, zeolite, sand, and iron filings as filter materials for nutrient removal. They found that the range of removal for nitrate was between 39% to 65% for calcite, 42% to 77% for zeolite, 40% to 70% for sand, and 74% to 100% for iron filings. On the other hand, the removal of phosphate ranged from 35% to 41% for calcite, 59% to 100% for zeolite, 49% to 100% for sand, and 73% to 100% for iron filings. The removal of phosphate via alum was studied for the particular sorption capacity of phosphate via the use of activated alumina columns (Brattebo and Odegaard 1986, Hano et al. 1997). Furthermore, while investigating the best Fe/Al molar ration, Sousa et al. (2012) suggested that the relationship between the iron content and the surface area is important for phosphate adsorption, whereas the presence of aluminum oxide provides texture, promoting a larger surface area. Although Huang (1977) reported phosphate removal efficiency of up to 85% via powdered aluminum, indicating its potential as a filtration material, removal by aluminum powder remains poorly understood.

Some dynamic adsorption models can be utilized to evaluate adsorption performance and the breakthrough process of filtration materials, allowing the assessment of the filtration media in real world applications. These dynamic adsorption models, including Thomas, Bohart-Adams (B-A), and Modified Dose-Response (MDR), can further predict the equilibrium state of adsorption capacity for the candidate filtration material, which may support calculation of the life expectancy of the media for engineering applications. Moreover, the Yoon-Nelson, as well as the Clark and Wang models, permit the characterization of fixed-bed media columns for engineering design (Hanen and Abdelmottaleb 2013).

Given that the replacement and disposal cost of the media can account for about 80% of the cost associated with the treatment, the in-situ regeneration of the media is one possible alternative to reduce costs. This alternative is achievable by subjecting the media to a desorption process that can likewise allow the recovery of adsorbed nutrients in effluent. The effluent solution from the desorption process can be collected for treatment and application in agriculture as a substitute for fertilizers. This option is cost effective and environmentally sustainable, as it eliminates the cost associated with the replacement of the media, minimizes the environmental impact on landfill disposal, and reduces the need for P mining. Less demand for P mining is the most advantageous result, given the fast depletion of the Earth's current phosphate reserves. A recent study suggested that, with the continuation of P mining, the current reserves will be exhausted by 2040 (Blackwell et al. 2019). Without sufficient P and N to accommodate the agriculture demand, the capacity for food production will be reduced by half (Carrington 2019).

Various studies investigated the optimum desorption reagents for the recovery of phosphate, nitrate, and ammonia from different adsorbents (Kuo et al. 1988, Zhao et al. 2010). Desorbing reagents for different nutrients and metals involved the use of Calcium Chloride ($CaCl_2$), Sodium Hydroxide (NaOH), Potassium Chloride (KCl), and Hydrogen Chloride (HCl) (Guo et al. 2006, Reddy et al. 1980). NaOH was found to act as an efficient desorption reagent for nitrate and phosphate (Kawasaki et al. 2010, Saad et al. 2007) and is appropriate for the regeneration of metal oxides/hydroxides (Donnert 1999; Genz et al. 2004). Moreover, ammonia generation/sorption/recovery accounts for an important step in this study, as ammonia in high concentrations can stress aquatic life, and is also one of the most effective sources of nitrogen for plant growth (Araneda et al. 2011). Ammonia previously-removed by clay in the media mixes can be desorbed via the desorbing reagent KCl (Mamo et al. 1993). In addition to the described chemical desorption, another alternative is the direct reuse of saturated media as a soil amendment. This alternative also eliminates difficulties related to waste disposal.

Accordingly, what is needed is a synergistic alternative sorption media, particularly utilizing aluminum, used for nutrient removal and recovery. However, in view of the art considered as a whole at the time the present invention was made, it was not obvious to those of ordinary skill in the field of this invention how the shortcomings of the prior art could be overcome.

While certain aspects of conventional technologies have been discussed to facilitate disclosure of the invention, Applicant in no way disclaims these technical aspects, and it is contemplated that the claimed invention may encompass one or more of the conventional technical aspects discussed herein.

The present invention may address one or more of the problems and deficiencies of the prior art discussed above. However, it is contemplated that the invention may prove useful in addressing other problems and deficiencies in a number of technical areas. Therefore, the claimed invention should not necessarily be construed as limited to addressing any of the particular problems or deficiencies discussed herein.

In this specification, where a document, act or item of knowledge is referred to or discussed, this reference or discussion is not an admission that the document, act or item of knowledge or any combination thereof was at the priority date, publicly available, known to the public, part of common general knowledge, or otherwise constitutes prior art under the applicable statutory provisions; or is known to be relevant to an attempt to solve any problem with which this specification is concerned.

BRIEF SUMMARY OF THE INVENTION

The long-standing but heretofore unfulfilled need for an efficient, synergistic aluminum-based composition used to treat water is now met by a new, useful, and nonobvious invention.

The novel filtration system for treating water containing nitrogen compounds and phosphorus compounds includes a media chamber including a homogenously mixed synergistic composition, the homogenously mixed synergistic composition including a mixture of iron filings of at least 5 vol %, clay particles of at least 2 vol %, and aluminum particles of at least 2.5 vol %. In an embodiment, the iron filings are between 5 vol % and 7.5 vol %. In an embodiment, the clay particles are between 2 vol % and 3 vol %. In an embodiment, the aluminum particles are between 2.5 vol % and 5 vol %. The aluminum particles may be aluminum flakes or aluminum powder. The clay particles are configured to attract the nitrogen compounds and the phosphorus compounds to be absorbed onto a surface of the iron filings and the clay particles. The aluminum particles react with nitrogen compounds via an oxidation reaction to form ammonia compounds, thereby removing and recovering the nitrogen compounds. The aluminum particles also react with the phosphorus compounds to produce aluminum phosphate, thereby removing and recovering the phosphorus compounds. An embodiment of the composition further includes sand particles of between 78 vol % and 85 vol %. An embodiment of the composition includes tire crumb of between 7.5 vol % and 10 vol %.

A method of treating water includes mixing the synergistic composition and flowing water that contains nitrogen compounds and phosphorus compounds through the synergistic composition. The clay particles attract the nitrogen and phosphorus compounds, which are absorbed onto a surface of the iron filings and the clay particles. The aluminum particles remove at least a portion of the nitrogen compounds and at least a portion of the phosphorus compounds, thereby synergistically removing and recovering nitrogen and phosphorus from the water. The water may be stormwater runoff, wastewater effluent, agricultural discharge, and combinations thereof.

An object of the invention is to improve nitrogen and phosphorus removal and recovery from fluids, such that the removed nitrogen and phosphorus can be reused, by utilizing a synergistic mixture of iron filings, clay particles, and aluminum particles, thereby improving on the filtration media already known within the art.

These and other important objects, advantages, and features of the invention will become clear as this disclosure proceeds.

The invention accordingly comprises the features of construction, combination of elements, and arrangement of parts that will be exemplified in the disclosure set forth hereinafter and the scope of the invention will be indicated in the claims.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

For a fuller understanding of the invention, reference should be made to the following detailed description, taken in connection with the accompanying drawings, in which.

DETAILED DESCRIPTION OF THE INVENTION

In the following detailed description of the preferred embodiments, reference is made to the accompanying drawings, which form a part thereof, and within which are shown by way of illustration specific embodiments by which the invention may be practiced. It is to be understood that other embodiments may be utilized and structural changes may be made without departing from the scope of the invention.

As used in this specification and the appended claims, the singular forms "a," "an," and "the" include plural referents unless the content clearly dictates otherwise. As used in this specification and the appended claims, the term "or" is generally employed in its sense including "and/or" unless the context clearly dictates otherwise. As used in this specification and the appended claims, the terms "about," "approximately," and "substantially" means a value of ±15% unless the context clearly dictates otherwise.

The present invention includes a synergistic composition that can be used to treat water containing nitrogen compounds and phosphorus compounds. The synergistic composition includes iron filings, clay particles, aluminum particles, and sand particles. The iron filings, clay particles, and aluminum particles act synergistically to remove nitrogen compounds and phosphorus compounds from water. Specifically, the clay particles attract the nitrogen compounds and the phosphorus compounds to be absorbed onto a surface of the iron filings and the clay particles. The aluminum particles react with the nitrogen compounds via an oxidation reaction to form ammonia compounds, and react with the phosphorus compounds to produce aluminum phosphate. As such, the synergistic relationship between the iron filings, clay particles, and aluminum particles remove nitrogen and phosphorus compounds from water and recover the compounds in usable forms, namely, ammonia and aluminum phosphate. Embodiments of the synergistic composition are described herein below.

Example 1—Methods

Figure 1:
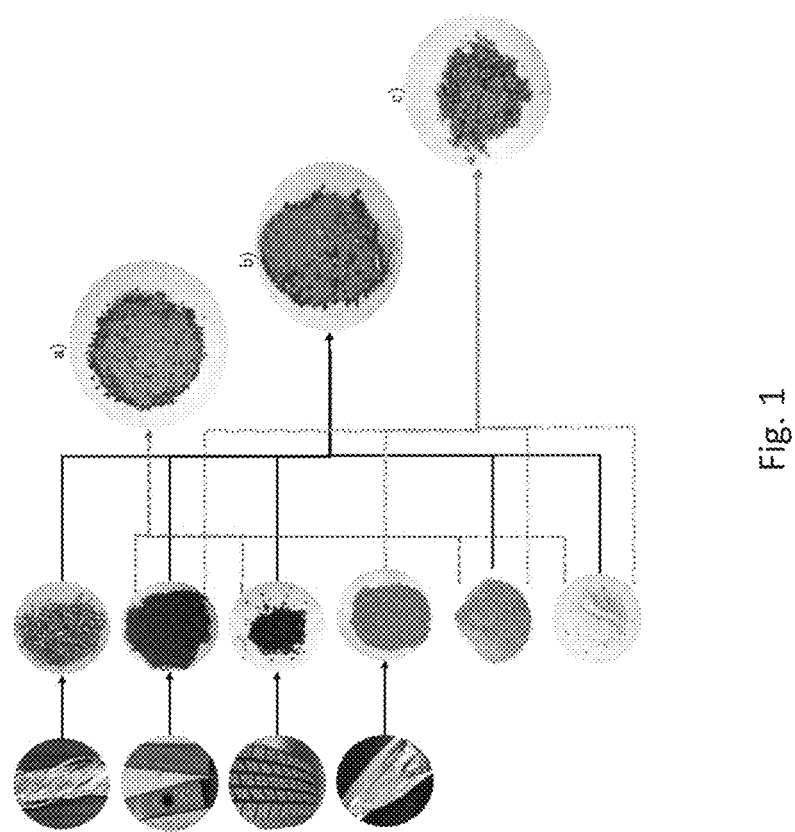
FIG. 1 depicts raw materials that are included in different filtration compositions, including iron-based compositions in section A, and aluminum-based compositions in sections B and C, in accordance with an embodiment of the present invention.
Figure 2:
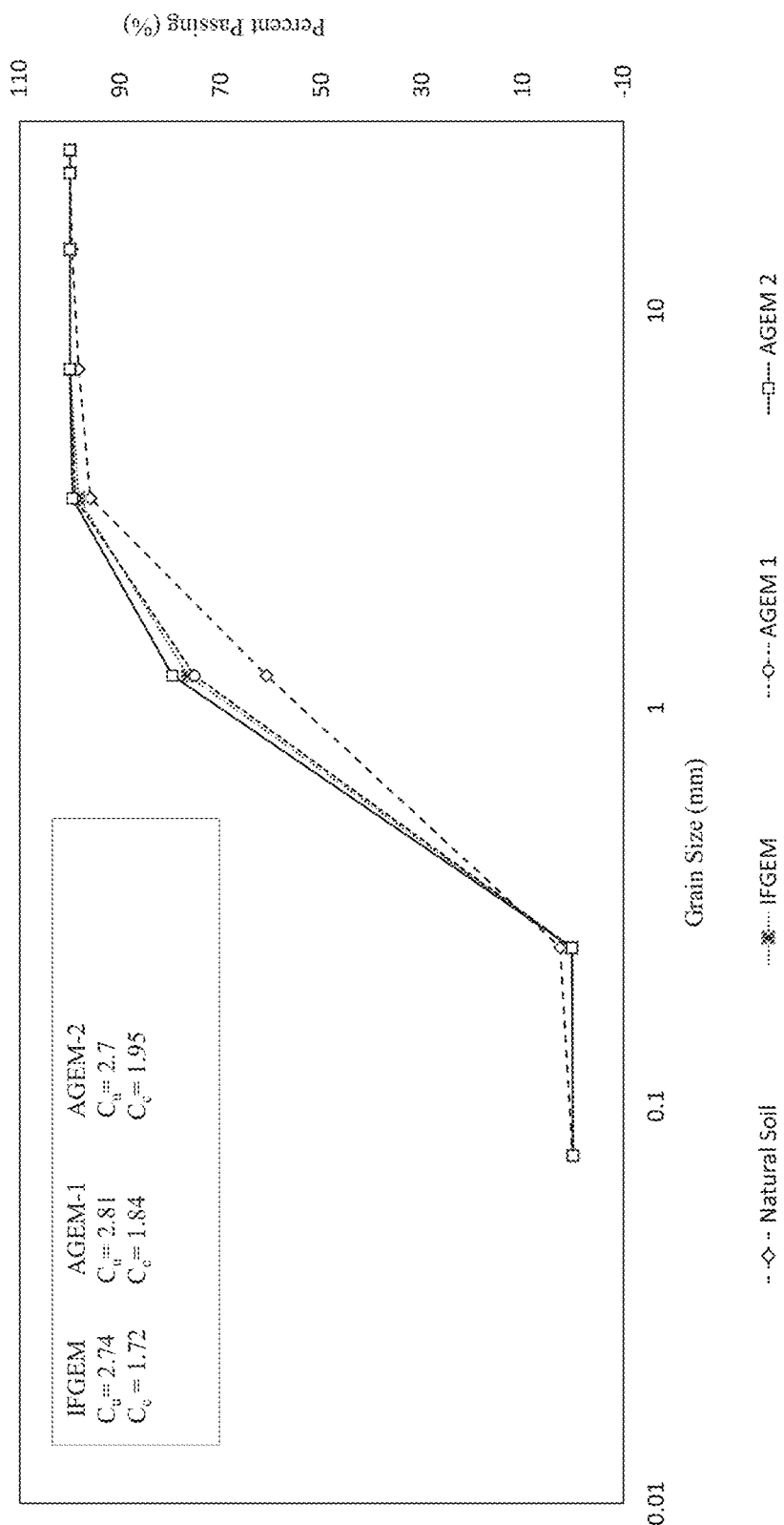
FIG. 2 is a graphical depiction of particle size distribution for natural soil, as compared with three filter media.

IFEGM, AGEM-1, and AGEM-2 are known as green sorption media because of the inclusion of recycles. An iron-based sorption media (IFGEM) and two new aluminum-based sorption media (AGEM-1 and AGEM-2) were analyzed for their nutrient adsorption capacities. The aluminum used in AGEM-1 is in the form of flakes obtained from a recycled power rod, while aluminum powder produced from ground aluminum foil was used in AGEM-2. Recycled power rod composition normally ranges from 51.13 to 97.72% aluminum, while the remaining percentage corresponds to steel; thus, this percentage depends on the type, size, and diameter of the aluminum rod. The power rod utilized in this study has an outer diameter of 1.8 inches, and has been categorized as a Thrasher aluminum conductor steel reinforced (ACSR) composed of 86.73% aluminum (Landsman et al.). However, the aluminum foil used in this study was composed of 99% aluminum. IFGEM, AGEM-1, and AGEM-2 contain iron filing, clay, and sand at different ratios, while IFGEM and AGEM-1 also contain tire crumb from recycled tires. Lastly, natural soil collected from a basin located in the city of Ocala, Fla. was analyzed as a basis for comparison with the different media studied. The percent and ratio by volume and the weight of each component of the media are summarized in Table 1. The images of the materials used to develop the media and final products are also presented in FIG. 1, and FIG. 2 depicts JEOL™-SEM (Scanning Electron Microscopy) images of raw green sorption media mixes: a) IFGEM and b) AGEM.

Furthermore, IFGEM, AGEM-1, and AGEM-2 media samples were delivered to the EMSL Analytical, Inc laboratories for BET surface area, density, and particle size sieve analyses. EMSL generates measurements of BET surface area and pore size distribution via an ASAP 202 Automatic Micropore and Chemisorption Analyzer. The density of each individual component was measured in the geotechnical laboratory at the University of Central Florida. The weight of each media component was derived by multiplying the experimental density (in g/ml) by the volume (in ml), in accordance with equation 7:

$$\rho\left(\frac{g}{ml}\right) = \frac{m(g)}{v(ml)} \quad (7)$$

Media hydraulic conductivity (k) and porosity were measured in the geotechnical laboratory at the University of Central Florida (Table 2). As a base for comparison, natural soil was analyzed for density, surface area, hydraulic conductivity, and porosity (Table 2, in which values in parentheses signify standard deviations). FIG. 2 indicates the distribution of the media through a broad range of sizes; however, given that the uniformity coefficient for all media fell under 4, all media can be categorized as uniformly graded in the sense that the particle sizes are identical. For a media (soil) to be well graded, its uniformity coefficient ($C_u$) must be greater than 4 and the coefficient of gradation ($C_c$) should be in the range of 1 to 3. Based on the $C_u$, AGEM-1 has a wider range of particle, followed by IFGEM, and lastly AGEM-2. Moreover, AGEM-2 has increased $C_c$ due to the removal of tire crumb. Thus, AGEM-1 had a higher density in comparison to IFGEM due to its decreased sand percentage, which allowed for the inclusion of aluminum in flakes.

TABLE 1

Media components by percent volume and weight

| Media Component | IFGEM Vol % | IFGEM Weight (g) | IFGEM Mixture Ratio (by vol) | AGEM-1 Vol % | AGEM-1 Weight (g) | AGEM-1 Mixture Ratio (by vol) | AGEM-2 Vol % | AGEM-2 Weight (g) | AGEM-2 Mixture Ratio (by vol) |
|---|---|---|---|---|---|---|---|---|---|
| Sand | 83 | 1.806 | 41.5 | 78 | 1.698 | 39 | 85 | 1.850 | 28.3 |
| Iron filings | 5 | 0.340 | 2.5 | 5 | 0.340 | 2.5 | 7.5 | 0.511 | 2.5 |
| Tire crumb | 10 | 0.097 | 5 | 10 | 0.097 | 5 | — | — | — |
| Clay | 2 | 0.020 | 1 | 2 | 0.020 | 1 | 3 | 0.030 | 1 |
| Aluminum flakes | — | — | — | 5 | 0.070 | 2.5 | — | — | — |
| Aluminum powder | — | — | — | — | — | — | 4.5 | 0.079 | 1.5 |

Each component of the media serves a purpose in the physiochemical adsorption of nitrate, phosphate, and ammonia. Clay is included as a component of these two media, given that it aids in the removal of ammonia and the reduction of nitrate due to its physical characteristics (Lee et al. 2009). Recycled tire crumb contributes to the hydraulic conductivity of the media by minimizing clogging. Sand provides an appropriate void space for accurate distribution of the influent (Valencia). Iron in the media assists in the reduction of nitrate to ammonia following equation 1, resulting in the production of alkalinity that causes an increase in pH (Choe et al. 2004). This outcome emphasizes the importance of the correct ratio of iron to clay in the media to the removal of nutrients, given that it may interfere with surroundings (Cheng 1997).

$$NO_3^- + 4Fe + 10H^+ \rightarrow NH_4^+ + 4Fe^{2+} + 3H_2O \quad (1)$$

The precipitation of phosphate via $Fe^{2+}$ results in the formation of vivianite precipitate $[(Fe_3(PO_4)_2)8H_2O]$ and it follows equation 2 (Frederickson 1998).

$$3Fe^{2+} + 2HPO_4^{2-} + 8H_2O \rightarrow Fe_3(PO_4)_2 8H_2O + 2H^+ \quad (2)$$

The precipitation of phosphate is also possible in the presence of aluminum, as it forms an insoluble salt, $AlPO_4$, following equation 3 (Martin 1986).

$$Al^{3+} + H_3PO_4^- \rightarrow AlPO_4 + 2H^+ \quad (3)$$

Furthermore, aluminum can aid in the reduction of nitrate to ammonia (equations 4 and 5) or nitrogen gas (equations 4 and 6) (Murphy 1991; Luk 2002).

$$3NO_3^- + 2Al + 3H_2O \rightarrow 3NO_2^- + 2Al(OH)_3 \quad (4)$$

$$NO_2^- + 2Al + 5H_2O \rightarrow NH_3 + 2Al(OH)_3 + OH^- \quad (5)$$

$$2NO_3^- + 2Al + 4H_2O \rightarrow N_2 + 2Al(OH)_3 + 2OH^- \quad (6)$$

Adsorption is the physical and chemical phenomenon that occurs when atoms, molecules, or ions from a solution adhere to a surface: green sorption media, in this case. Adsorption is achieved from the formation of a film or thin layer on the surface of the adsorbent material (Heraldy et al. 2016). Different models have been developed through time to predict the adsorption capacity of the various sorption media.

TABLE 2

Soil and sorption media characteristics

| | Natural Soil | IFGEM | AGEM-1 | AGEM-2 |
|---|---|---|---|---|
| Bulk Density (g/cm³) | 2.36 | 1.37 | 1.42 | 1.52 |
| Surface Area (m²/g) | 9.4 | 1.0 | 1.3 | 1.7 |
| Porosity (%) | 40.43 (2.86) | 25.53 (1.03) | 30.54 (1.72) | 29.072 (0.93) |

TABLE 2-continued

Soil and sorption media characteristics

|  | Natural Soil | IFGEM | AGEM-1 | AGEM-2 |
|---|---|---|---|---|
| Hydraulic Conductivity (cm/s) | 0.003 (5.76) | 0.0314 (0.001) | 0.030 (0.0007) | 0.027 (0.00045) |

Figure 3:
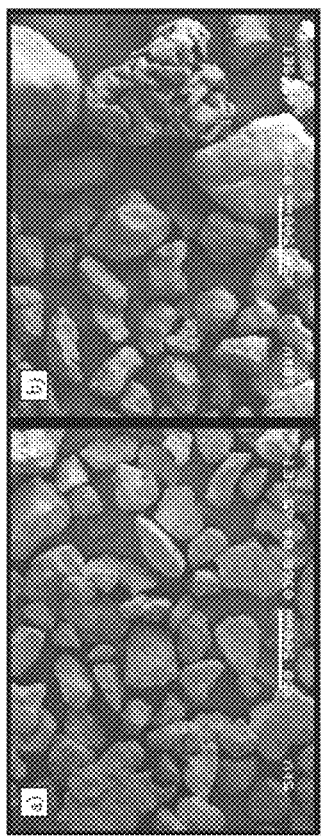
FIG. 3 depicts a series of scanning electron microscopy images showing different filtration compositions, specifically showing iron-based compositions in section A and aluminum-based compositions in section B.

Magnified photographs of the media mixes of IFGEM and AGEM-2 were taken by a JEOL JSM-6480 Scanning Electron Microscopy (SEM) at the Advanced Material Processing and Analysis Center at the University of Central Florida (as shown in FIG. 3). The main nutrient removal process was expected to be adsorption/absorption by the sorption media, resulting in the formation of a thin layer on the surface of the media (Heraldy et al. 2016). However, the holistic nutrient removal processes include ion exchange, reduction-oxidation, and precipitation. Each different component of the media serves a distinct purpose in the physiochemical processes for the removal of nitrate, phosphate, and ammonia. Recycled tire crumb, which the research team proved to be non-toxic to the ecosystem, contributes to the hydraulic conductivity of the media by minimizing clogging, while also increasing sorption processes capacity (Hossain et al. 2010; O'Reilly et al, 2012). Sand provides an appropriate void space for the accurate distribution of the influent (Valencia et al. 2019a). Clay serves for ion exchange for the removal of ammonia and reduction of nitrate due to its physical characteristics (Lee et al. 2009). Clay in the mixture (kaolinite $Al_2O_3 2SiO_2 2H_2O$) can further react with ammonia and orthophosphoric chemicals to aid in the formation of ammonium dihydrogen phosphate and diammonium hydrogen phosphate, which are commonly used as phosphate fertilizers (Jiao et al. 2012; McGowen et al. 2001; Saueia and Mazzilli 2006).

The results of previous studies of similar media mixes are presented in Table 3 for comparison with the current study, elucidating the effect of the inclusion of aluminum on nutrient removal and the potential for nutrient recovery. The nutrient removal of IFGEM containing iron is higher than that of IFGEM-1 and IFGEM-2. Hence, the IFGEM explored in this analysis is also denoted as IFGEM-3. In any circumstance, the levels of nutrient removal in natural soil are low in comparison to these three green sorption media mixes.

TABLE 3

Nutrient removal of natural soil and media mixes

| Media Name | TN Removal | Nitrate Removal | TP Removal | Reference |
|---|---|---|---|---|
| Natural Soil | — | −166%-0.27% | −108%-4.8% | Chang et al. (2018a) |
| Biosorption Activated Media (BAM) | — | 45%-80% | −165%-54% | Chang et al. (2019) |
|  | 48%-70% | — | 4%-93% | Chang et al. (2019) |
| IFGEM-1 | — | 91%-95% | 54%-83% | Chang et al. (2019) |
|  | 85%-94% | — | 60%-92% | Valencia et al. (2019a) |
| IFGEM-2 | — | 88%-94% | 26%-62% | Chang et al. (2019) |
| IFGEM-3 | 91%-94% | — | 81%-92% | Valencia et al. (2019a) |
|  | 81%-97% | — | 50%-92% | Valencia et al. (2020) |
|  | — | 42% | 97% | Ordonez et al. (2020) |
| AGEM-2 | — | 52% | 98% | Ordonez et al. (2020) |

All analyses of water samples were performed via a Hach TNTplus™ vial test at the chemical analysis laboratory at the University of Central Florida. The water parameters of ammonia, total phosphorus, and nitrate were analyzed with the methods 10205, 10209, and 10206, respectively, while pH, oxidation-reduction potential (ORP), and dissolved oxygen (DO) were analyzed via a Waterproof Double Junction pH Test® 30 and HACH HQ40D—IntelliCAL LDO101 LDO. Water samples were stored at −4° C. directly after collection and analyzed within 24 hours.

Based on its versatile utilization, green sorption media can be a promising candidate as a substrate in a constructed wetland. Studies of sand-based sorption media in a linear ditch along a roadway and in an infiltration basin have demonstrated convincing results for implementation at the field scale (Chang et al. 2018b; Wen et al. 2020b). The selection of substrate in the design of a constructed wetland is based on an appropriate hydraulic permeability, adsorption capacity, and adequate environment for microbial and plant growth. Previous studies on the appropriate hydraulic retention time (HRT) indicated that higher nutrient removal is obtained in constructed wetlands with longer HRT (Sakadevan and Bavor. 1999; Sirianuntapiboon et al. 2006). There are two main types of constructed wetlands based on hydrology: free water surface and subsurface flow. The recommended HRT in days for a free water surface constructed wetland is 5-30 days, while for a subsurface flow constructed wetland it is 2-5 days (Wu et al. 2015). However, Sawaittayothin and Polprosert (2006) suggested that a HRT of 8 days results in high treatment efficiencies (91% BOD5 removal, 96% TN removal and >99% total and fecal coliform) based on a pilot scale subsurface flow constructed wetland experiment. The pilot size in the study by Sawaittayothin and Polprosert (2006) had the dimensions of 0.5 m×4 m×0.5 m (width×length×depth). Moreover, the HRT of BAM was compared to the HRT of IFGEM-1, IFGEM-2, IFGEM, AGEM-1, and AGEM-2 through different column studies utilizing DI (distilled) water, stormwater, or groundwater (Table 4). The HRT comparisons in Table 4 suggest that the green media mixes can be implemented at the field-scale, as the HRT are comparable. Furthermore, longer HRTs were observed in column studies utilizing stormwater as a result of the development and growth of biofilm. Moreover, the utilization of the Al/Fe based green sorption media as a substrate in a constructed wetland can diminish the need to inject other chemicals, like alum (DB Environmental, Inc 2006), used to increase nutrient removal, given that such a technique can result in undesired aluminum sludge.

TABLE 4

Comparison of HRT among different sorption media mixes

| Media Name | Experimental Setup | HRT (hours) | Hydraulic Conductivity (cm/sec) | Reference |
|---|---|---|---|---|
| Natural Soil | Column Study<br>Column size: 3 ft (90 cm) depth and 4 in (10.2 cm) diameter<br>Influent flow rate: 8 ml/min<br>Stormwater<br>Media recipe: natural soil collected from a stormwater basin located Ocala, FL (USGS characterization: 22 Candler sand) | 12 | 0.003 | Valencia et al. (2020) |
| BAM | Column Study<br>Column size: 4 ft (122 cm) depth and 6 inches (6 cm) diameter<br>Influent flow rate: 10 to 15 ml/min<br>Stormwater and groundwater<br>Media recipe: 85% sand, 10% tire crumb, 5% clay | 1.30-1.89 | 0.026 | Chang et al. (2019) |
|  | Column Study<br>Column size: 3 ft (90 cm) depth and 4 in (10.2 cm) diameter<br>Influent flow rate: 8 ml/min<br>Stormwater<br>Media recipe: 85% sand, 10% tire crumb, 5% clay | 1.22 |  | Valencia et al. (2020) |
| Woodchip | Column Study<br>Column size: 4 ft (122 cm) depth and 6 inches (6 cm) diameter<br>Influent flow rate: 10 to 15 mL/min<br>Stormwater and groundwater<br>Media recipe: 100% woodchip | 0.68-0.70 | — | Chang et al. (2019) |
| IFGEM-1 | Column Study<br>Column size: 3 ft (90 cm) depth and 4 in (10.2 cm) diameter<br>Influent flow rate: 8 ml/min<br>Stormwater<br>Media recipe: 96.2% sand, 3.8% iron filing | 2.28 | 0.028 | Valencia et al. (2020), Wen et al. (2020c) |
|  | Column Study<br>Column size: 3 ft (90 cm) depth and 4 in (10 cm) diameter<br>Influent flow rate: 8 ml/min<br>*DI water<br>Media recipe: 96.2% sand, 3.8% iron filing | 0.4 |  |  |
| IFGEM-2 | Column Study<br>Column size: 3 ft (90 cm) depth and 4 in (10 cm) diameter<br>Influent flow rate: 8 ml/min<br>*DI water<br>Media recipe: 80% sand, 10% tirecrumb, 5% iron filing, 5% clay | 0.7 | 0.017 | Wen et al. (2020c) |
| IFGEM-3 | Column Study<br>Column size: 1 ft (30.5 cm) depth and 2 inches (5.1 cm) diameter<br>Influent flow rate: 3 ml/min<br>*DI water<br>Media recipe: 83% sand, 10% tirecrumb, 5% iron filing, 2% clay | 1.12 | 0.031 | Ordonez et al. (2020) |
|  | Column Study<br>Column size: 3 ft (90 cm) depth and 4 in (10.2 cm) diameter<br>Influent flow rate: 8 ml/min<br>Stormwater<br>Media recipe: 83% sand, 10% tirecrumb, 5% iron filing, 2% clay | 2.25 |  | Valencia et al. (2020c) |
| AGEM-1 | Current study<br>Media recipe: 78% sand, 10% tirecrumb, 5% iron filing, 5% aluminum flakes 2% clay | — | 0.030 | Example 1 |

TABLE 4-continued

Comparison of HRT among different sorption media mixes

| Media Name | Experimental Setup | HRT (hours) | Hydraulic Conductivity (cm/sec) | Reference |
| --- | --- | --- | --- | --- |
| AGEM-2 | Column Study<br>Column size: 1 ft (30.5 cm) depth and 2 inches (5.1 cm) diameter<br>Influent flow rate: 3 ml/min<br>*DI water<br>Media recipe: 85% sand, 7.5% iron filing, 4.5% aluminum powder, 3% clay | 1.15 | 0.027 | Ordonez et al. (2020) |

Given that stormwater runoff and agricultural discharge carry phosphate and nitrate in nature, a series of isotherm batch tests with influent containing phosphate and nitrate simultaneously were applied to natural soil, IFGEM, AGEM-1, and AGEM-2 for a holistic comparison. In this procedure, the influent was spiked with nitrate and phosphate at different concentration levels for assessment of the effect of contact time. The difference between contact time-based isotherms and adsorbent dosage isotherms is summarized in Appendix 1. The kinetics were explored as well in this analysis. Three influent conditions (e.g., concentration levels) that encompass stormwater runoff and agricultural discharge were selected for this study (Poe et al. 2003; Hart et al. 2004; Badruzzaman et al. 2012; Yang and Toor 2017). They are condition 1 (denoted C1 hereafter), consisting of 0.9 mg/L $NO_3^-$ and 0.3 mg/L $PO_4^-$; condition 2 (denoted C2 hereafter), which was 1.5 mg/L NO and 0.9 mg/L $PO_4^-$; and condition 3 (denoted C3 hereafter), which was 2 mg/L NO and 2 mg/L $PO_4^-$. The procedure for preparing each media mix consisted of filling five 500 ml glass flasks with 50 grams of media and 300 ml of spiked DI water for each respective condition. Subsequently, all flasks were covered with parafilm and constantly mixed at 200 rpm in a shaking platform. The solutions were extracted from each flask at different time intervals until the media reached equilibrium. The solutions were extracted and filtered utilizing a 0.45 μm filter. Subsequently, the water samples were analyzed for phosphate, nitrate, ammonia, pH, ORP, and DO with Hach TNTplus™ vial test kits. Prior to such analysis, each media mix was flushed with DI water for 24 hours and then oven-dried at 78° C. for 24 hours to assure only chemo-physical reactions could happen. Similarly, all flasks utilized in this analysis were acid washed with 10% hydrochloric acid and oven-dried at 180° C. for 24 hours.

To characterize the adsorption capacity of each mixture of media, data obtained from each isotherm study were adopted into the equilibrium models presented below. A total of six isotherm models were used to interpret the experimental data, including Langmuir, Freundlich, First Modified Langmuir, Temkin, Jovanovic, and Elovich. The Langmuir isotherm model is widely used, as it can be applicable for both liquid and gas adsorptions (Heraldy 2016; Dubey et al. 2016; Azizian et al. 2018). It describes monolayer adsorption and assumes a finite number of adsorption sites with equal size and shape (homogenous surface). All adsorption occurs via the same mechanism, and thus the free energy is not reliant on the surface coverage (Reed et al. 1993). The non-linear form of the Langmuir isotherm is as follows:

$$q_e = q_{max} K_L \left( \frac{c_e}{1 + K_L c_e} \right) \quad (8)$$

The constants $K_L$ and $q_{max}$ measure the affinity of adsorbate for adsorbent (unitless) and the maximum capacity of adsorbent for adsorbate (mg/g), respectively. The amount adsorbed by the media per unit mass of adsorbent is characterized by $q_e$ (mg/g). The constant $q_e$ was calculated by plugging the influent concentration ($q_0$) in mg/L, effluent concentration ($q_t$) in mg/L, volume of solution (V) in L, and mass of media (x) in grams into equation 9.

$$q_e = \frac{(q_0 - q_t) * V}{x} \quad (9)$$

The aqueous concentration of adsorbate is represented as $C_e$ (mg/L). (The terms $q_e$ and $C_e$ have the same meaning in all subsequent equilibrium models). The values of $K_L$ and $q_{max}$ can be derived from the linear regression of $$\frac{1}{q_e}$$

versus $$\frac{1}{C_e}.$$

The Freundlich isotherm is an empirical model widely applied to model the sorption of soils (Fitter et al. 1975), and it is used to categorize heterogeneous surfaces (Dada et al. 2012) or adsorption at various sites (Gusain et al. 2016). This model assumes multi-layer adsorption with reversible adsorption and uniform energy distribution (Dubey et al. 2016). The non-linear equation is described as:

$$q_e = K_f C_e^{1/n} \quad (10)$$

The constant $K_f$ estimates the maximum adsorption capacity of the media (mg/g), thus n represents the strength of the distribution bond. If n<1, the bond energy increases with surface density; thus, if n>1 the bond energy decreases with surface density (Reed et al. 1993). By plotting log $q_e$ versus log $C_e$, the values for $K_f$ and $q_e$ can be determined from the slope and intercept provided by linear regression.

The First Langmuir Modified model considers the surface coverage of adsorption and does not require the formulation of any assumptions (Valencia et al. 2019). Its non-linear equation is given as:

$$\frac{C_e}{q_e} = \frac{C_s}{q_{max}K_{ML}} + \frac{(K_{ML}-1)C_e}{q_{max}K_{ML}} \qquad (11)$$

In this model, the constant $C_s$ is the saturation concentration of solute in the bulk solution (mg/L). In a normal case of adsorption $C<C_s$, therefore $C_s$ can be assumed as 1 (Azizian et al. 2018). This model also allows the estimation of maximum adsorption $q_{max}$ (mg/g) and $K_{ML}$ or the equilibrium constant (dimensionless). The plot of $$\frac{C_e}{q_e}$$

versus $C_e$ yields $K_{ML}$ and $q_m$ after solving for the slope and intercept.

The Temkin isotherm model assumes a linear decrease in heat of sorption, and it further considers the effect of adsorbate and adsorbent on the adsorption process Can et al. 2016). Thus the absolute temperature (T in ° K) and the universal gas constant (R or 8.314 kJ/mol ° K) are considered in this model (Vijayaraghavan et al. 2006; Kundu et al. 2006). This model has been studied for determining the heat of adsorption in modified activated carbon (Ibrahim et al. 2017). The non-linear form is presented as:

$$q_e = B_1 \ln K_T + B_1 \ln C_e \qquad (12)$$

where $$B_1 = \frac{RT}{b_t};$$

this model permits the calculation of the $K_T$, or the Temkin isotherm equilibrium binding constant (L/g) corresponding to the maximum binding energy (Johnson et al. 1995), and $b_t$, or the Temkin constant related to the adsorption of energy (kJ/mol), by plotting $q_e$ versus $\ln C_e$.

Assumptions similar to those used in the Langmuir isotherm model are considered in the Jovanovic isotherm model, with a further assumption related to the likely mechanical contact between adsorbate and adsorbent (Quinones et al. 1998). This isotherm model was initially derived for gas adsorption and was later expanded to other adsorbates (Can et al. 2016; Jovanovic 1969). The non-linear form is:

$$q_e = q_{max}[1-\exp(-K_jC_e)] \qquad (13)$$

The Jovanovic constant related to energy of adsorption and maximum adsorption (mg/g) are represented by $K_J$ and $q_{max}$, respectively. These values can be derived from the plot produced by $\ln q_e$ versus $C_e$.

The Elovich isotherm is generally used for describing heterogenous gas adsorption on solid surfaces and can be applied for adsorption and desorption processes (Inyang et al. 2016). The Elovich isotherm model applies the principal of multilayer adsorption, implying that adsorption sites increase exponentially with adsorption. The non-linear equation is expressed as equation 14:

$$\frac{q_e}{C_e} = q_{max}K_e\exp\left(-\frac{q_e}{q_{max}}\right) \qquad (14)$$

The constants $K_e$ and $q_{max}$ represent the Elovich equilibrium constant (L/mg) and the maximum adsorption (mg/g), respectively (Hamdaoui et al. 2007). These constants can be calculated from the line of best fit obtained from the plot of $$\ln\frac{q_e}{C_e}$$

versus $q_e$.

The main indices considered when deciding which model represents the best fit for its application include correlation coefficient value, $q_{max}$ (mg/g), and derived and stable performance for modeling on individual and competing reactions. First, the $R^2$ provided the goodness-of-fit between the theoretical and experimental data, with preferred $R^2=1$. Second, the agreement of the theoretical $q_{max}$ and actual experiment observations with regards to adsorption performance were compared for each nutrient species and condition. Third, the stable performance index based on the isotherm model most consistent and suitable for modeling individual and competitive adsorption for the three conditions associated with nitrate and phosphate was evaluated.

The effect of temperature on the nutrient removal treatability of the media mixes and the determination of the thermodynamic parameter of the media mixes were studied via a series of batch tests performed at different temperatures. The procedure consisted of preparing a 500 ml glass flask with 50 g of media and 300 ml of spiked water at the concentrations denoted previously as C1, C2, and C3. The three resultant solutions were mixed at 200 rpm for 1 hour. Each condition was run at an adjusted temperature of 12.78, 17.78, 22.78, 27.78 and 32.78 C°, respectively. The final solution was collected and filtrated with a 0.45 µm filter, and the water samples were analyzed for nitrate, ammonia, phosphate, pH, ORP, and DO.

Results

In real-world scenarios, nitrate and phosphate are found together in nature. Investigating their collective behavior and systematic response to the green sorption media requires a series of batch tests for the compound effect. The contact time required for proper nutrient treatment and the interaction necessary for nutrient removal were considered in this section. As a baseline, natural soil was included in the analysis.

Figure 4:
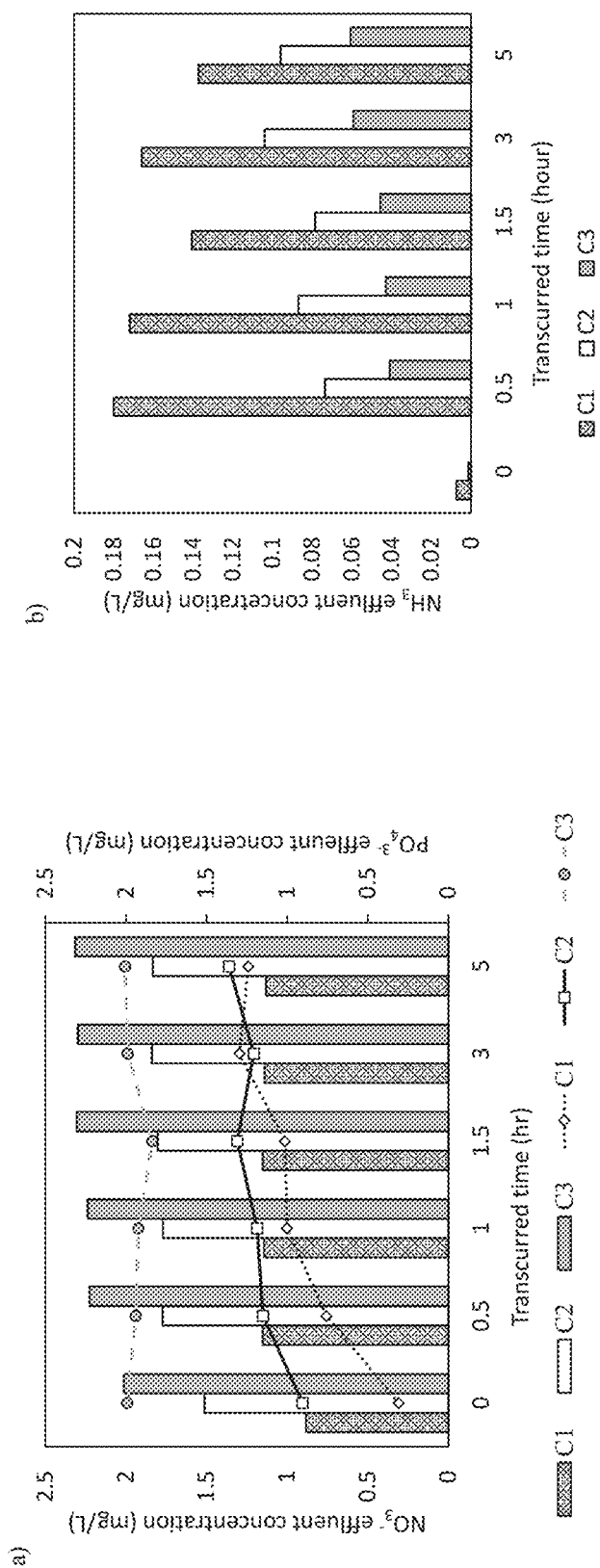
FIG. 4 is a graphical depiction of effluent concentration from natural soil at different time intervals, depicting the effluent concentration of nitrate and phosphate in section A, and the effluent concentration of ammonia in section B.

The results presented in FIG. 4 evidenced that natural soil was not capable of making collective nutrient removal, implying that natural soil is inadequate for treating two types of nutrients simultaneously. This conclusion agrees with the previous results presented in Table 3. The underperformance of natural soil for nutrient removal can be associated with the current nutrient saturation of soils, which impedes the further adsorption of nutrients. However, the influent condition played an important role in the performance of natural soil given that, at high nutrient concentrations, natural soil seems to provide some treatment (FIG. 4).

Figure 5:
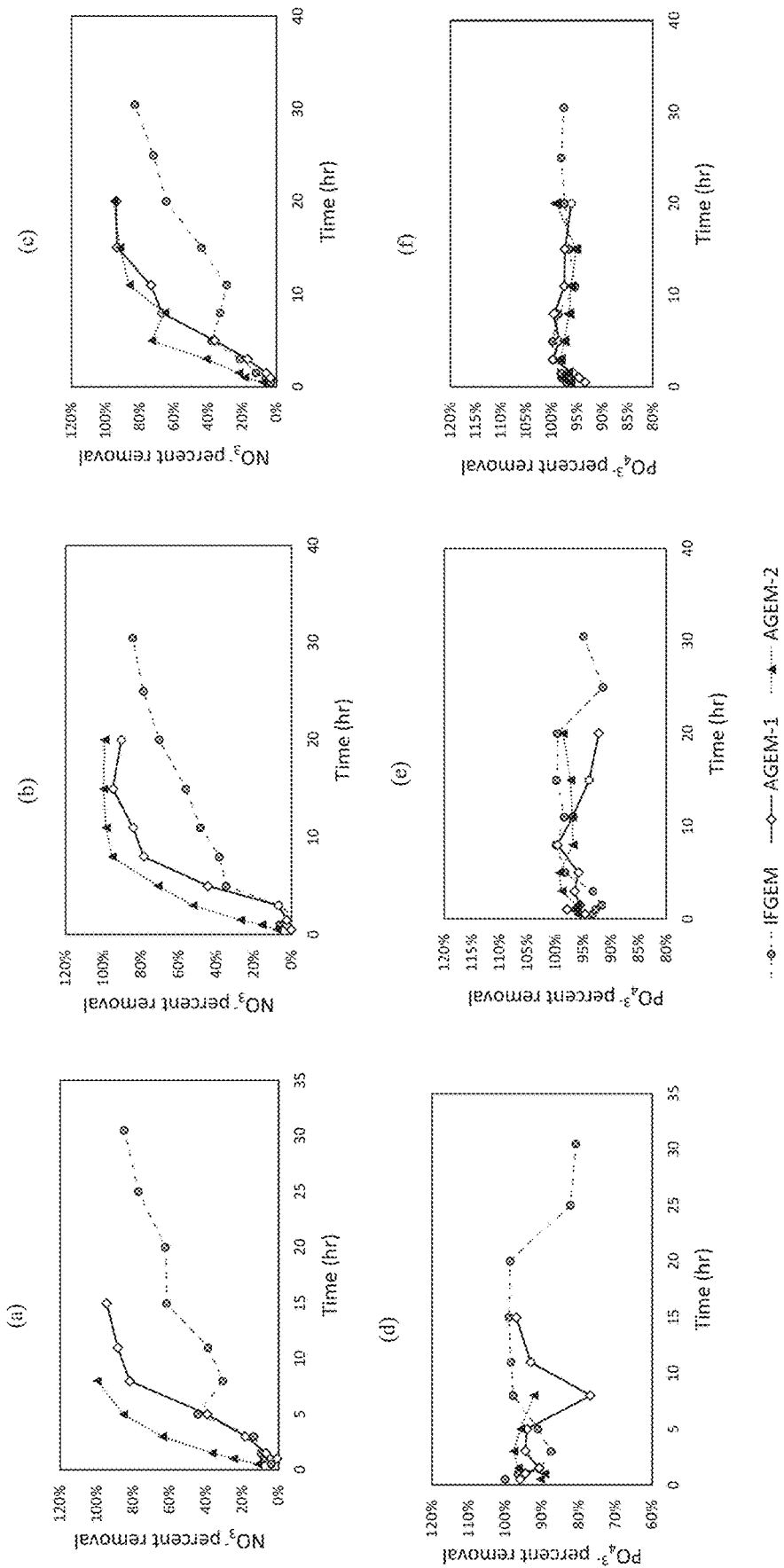
FIG. 5 graphically compares nitrate (in sections A, B, and C) and phosphate (in section D, E, and F) removal for three filter media.
Figure 6:
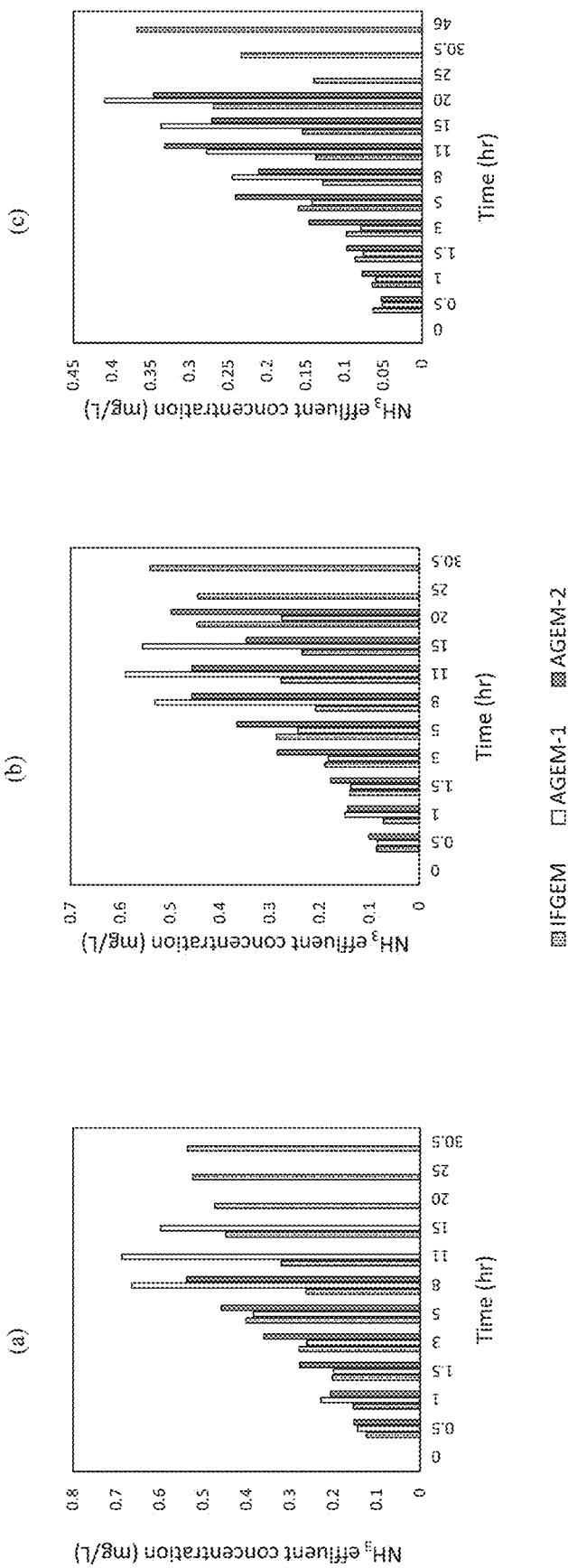
FIG. 6 graphically compares ammonia effluent concentration over time for three filter media over time in response to condition 1 consisting of 0.9 mg/L $NO_3$. and 0.3 mg/L $PO_4$. (in section A); condition 2 consisting of 1.5 mg/L $NO_3$. and 0.9 mg/L $PO_4$ (in section B); and condition 3 consisting of 2 mg/L $NO_3$. and 2 mg/L $PO_4$ (in section C).

In this study, the optimum time for nutrient removal in each green sorption media is defined as the time required to achieve over 80% nutrient (nitrate and phosphate) removal. AGEM-2 required the shortest amount of contact time to reach the targeted removal percentage, followed by AGEM-1, and IFGEM. AGEM-2 required 4.2 hours in condition 1, 6 hours in condition 2, and 10 hours in condition 3 to reach over 80% nitrate removal. AGEM-1 required approximately 8 hours of contact time to achieve 80% nitrate removal in condition 1, 8.2 hours in condition 2, and 13 hours in condition 3. IFGEM required the longest time to treat nitrate, with about 27 hours of contact time in condition 1 and condition 2, and 30 hours in condition 3, to reach the desired nitrate removal (over 80%) (FIG. 5 (section a,b,c)). There was almost no difference between AGEM-1 and IFGEM within the first 5 hours in terms of the efficiency of nitrate removal. However, after approximately 5 hours of contact time, AGEM-1 outperformed IFGEM. Additionally, it is noticeable that the nitrate removal of AGEM-2 exceeded that of AGEM-1 and IFGEM throughout the test. In terms of phosphate removal, all three green sorption media achieved over 90% removal after 30 minutes of contact time (FIG. 5 (section d,e,f)). However, IFGEM exhibited variance in the effluent concentrations, implying that prolonged contact time can provoke some leaching from the media. As time transpired, higher ammonia concentrations were observed in the effluent, especially in the AGEM-1 batch test (FIG. 6). Lastly, the variation within the curves in FIG. 5 are a result of natural fluctuation in the adsorption process.

The dynamic adsorption data were inserted into the pseudo-first and second-order kinetics models, and the obtained results are presented in Table 5 and Table 6. Nitrate adsorption in all media mixes was well described by the pseudo-first-order kinetics model. The average concentrations of the first-order sorption rate constant ($k_1$) for the nitrate adsorption of IFGEM, AGEM-1, and AGEM-2 mixes are 0.0014, 0.0049, and 0.0048 $min^{-1}$, respectively. Moreover, low correlation values ($R^2$) were obtained from the pseudo-second-order for AGEM-1 nitrate adsorption. In contrast to nitrate adsorption, the pseudo-second-order kinetics model was not applicable, given that low correlation values were obtained and a difference between the experimental $q_e$ values and predicted $q_e$ values was observed. However, the pseudo-second-order kinetics models exhibited a high $R^2$ for phosphate removal in IFGEM, AGEM-1, and AGEM-2 mixes, and the predicted $q_e$ values were close to the experimental $q_e$ values. The predicted second-order sorption rate constants ($k_2$) for phosphate adsorption for IFGEM, AGEM-1 and AGEM-2 are −10.80, 29.31, and 450.9 $g\ mg^{-1}\ min^{-1}$, respectively.

TABLE 5

Coefficients of nitrate sorption kinetics for IFGEM, AGEM 1, and AGEM 2 mixes under condition 1 (0.9 mg/L $NO_3^-$ and 0.3 mg/L $PO_4^-$), condition 2 (1.5 mg/L $NO_3^-$ and 0.9 mg/L $PO_4^-$), and condition 3 (2.0 mg/L $NO_3^-$ and 2.0 mg/L $PO_4^-$).

| | | First Order | | | Second Order | | |
|---|---|---|---|---|---|---|---|
| Mix | Initial Concentration (mg/L) | Calc. equilibrium uptake $q_c$ (mg/g) | $k_1$ ($min^{-1}$) | $R^2$ | Calc. equilibrium uptake $q_c$ (mg/g) | $k_2$ (g $mg^{-1}$ $min^{-1}$) | $R^2$ |
| IFGEM-3 | 0.9 | 0.0044 | 0.0014 | 0.8917 | 0.0064 | 0.1600 | 0.8113 |
| | 1.5 | 0.0089 | 0.0016 | 0.9536 | 0.0086 | 0.2351 | 0.1725 |
| | 2 | 0.0106 | 0.0012 | 0.908 | 0.0137 | 0.0713 | 0.8242 |
| | Average $k_1$ | | 0.0014 | | Average $k_2$ | 0.1555 | |
| AGEM-1 | 0.9 | 0.0073 | 0.0046 | 0.9601 | −0.0012 | 0.9622 | 0.2178 |
| | 1.5 | 0.0113 | 0.0037 | 0.9540 | −0.0020 | 0.4735 | 0.2031 |
| | 2 | 0.0253 | 0.0065 | 0.7539 | −0.0588 | 0.0023 | 0.0712 |
| | Average $k_1$ | | 0.0049 | | Average $k_2$ | 0.4796 | |
| AGEM-2 | 0.9 | 0.006 | 0.0064 | 0.997 | 0.0103 | 0.2327 | 0.9439 |
| | 1.5 | 0.0081 | 0.0046 | 0.9108 | 0.0127 | 0.2066 | 0.9307 |
| | 2 | 0.0108 | 0.0035 | 0.9348 | 0.0145 | 0.1975 | 0.97 |
| | Average $k_1$ | | 0.0048 | | Average $k_2$ | 0.2122 | |

TABLE 6

Coefficients of phosphate sorption kinetics for IFGEM, AGEM 1, and AGEM 2 mixes under condition 1 (0.9 mg/L $NO_3^-$ and 0.3 mg/L $PO_4^-$), condition 2 (1.5 mg/L $NO_3^-$ and 0.9 mg/L $PO_4^-$), and condition 3 (2.0 mg/L $NO_3^-$ and 2.0 mg/L $PO_4^-$).

| | | First Order | | | Second Order | | |
|---|---|---|---|---|---|---|---|
| Mix | Initial Concentration (mg/L) | Calc. equilibrium uptake $q_c$ (mg/g) | $k_1$ ($min^{-1}$) | $R^2$ | Calc. equilibrium uptake $q_c$ (mg/g) | $k_2$ (g $mg^{-1}$ $min^{-1}$) | $R^2$ |
| IFGEM-3 | 0.3 | 0.0002 | −0.0007 | 0.6048 | 0.0014 | −19.92 | 0.9963 |
| | 0.9 | 0.0002 | −0.0005 | 0.1365 | 0.0048 | −6.792 | 0.9932 |
| | 2 | 0.0001 | −0.0011 | 0.3363 | 0.0106 | −5.694 | 0.9996 |
| | Average $k_1$ | | −0.0008 | | Average $k_2$ | −10.80 | |
| AGEM-1 | 0.3 | 5.8E−5 | 0.0012 | 0.0888 | 0.0017 | 115.0 | 0.9795 |
| | 0.9 | 0.0002 | 0.0007 | 0.0497 | 0.0051 | −18.09 | 0.9999 |
| | 2 | 0.0002 | −0.0065 | 0.0562 | 0.0110 | −8.996 | 0.9964 |
| | Average $k_1$ | | −0.0015 | | Average $k_2$ | 29.31 | |
| AGEM-2 | 0.3 | 0.0001 | −0.0018 | 0.0987 | 0.0015 | −43.23 | 0.9872 |
| | 0.9 | — | — | — | 0.00525 | 1399.67 | 0.9998 |
| | 2 | 0.0001 | −0.0051 | 0.7407 | 0.0068 | −3.487 | 0.9901 |
| | Average $k_1$ | | −0.0034 | | Average $k_2$ | 450.9 | |

The thermodynamic adsorption assessment was performed for IFGEM and AGEM-2, and more promising results were observed. The results suggested that the nitrate and phosphate adsorption reactions for IFGEM proceeded as exothermic at all influent conditions except for phosphate adsorption at condition 3, which proceeded as an endothermic reaction. Similarly, the negative $\Delta H°$ obtained for AGEM-2 for phosphate adsorption at conditions 2 and 3 indicated exothermic behavior. In contrast, the positive change in enthalpy for nitrate adsorption at all concentrations and phosphate adsorption at condition 1 suggest endothermic reactions. Further, the positive $\Delta S°$ values obtained for nitrate at all influent conditions of AGEM-2 indicate a high affinity for the media to adsorb nitrate, while no affinity for nitrate adsorption was observed for IFGEM given the negative $\Delta S°$ values at all the conditions. High affinity to adsorb phosphate is suggested for IFGEM at condition 3 and AGEM-2 at condition 1, while the $\Delta G°$ values indicate the occurrence of spontaneous and favorable reactions for phosphate adsorption for both IFGEM and AGEM-2. On the other hand, the $\Delta G°$ values for nitrate adsorption indicate an endergonic or unfavorable reaction that requires energy input to proceed.

When assessing the overall performance of the isotherm models, the Langmuir, followed by the Freundlich model, were the most appropriate for describing nitrate and phosphate removals for IFGEM and AGEM-1. However, the First Modified Langmuir and Freundlich models performed better for nitrate and phosphate adsorption in AGEM-2, respectively. Even though Langmuir had a better overall performance, the good $R^2$ exhibited by Freundlich can be related to the assumption of multi-layers with reversible adsorption. This can possibly describe nitrate adsorption dynamics and the prolonged phosphate adsorption resultant of the continuous interaction of phosphate at each layer. The first modified Langmuir had a good performance in the description of nitrate adsorption. This model considers surface coverage of adsorption, suggesting that nitrate adsorption onto a particle's surface synergistically allows other particles in the liquid to interact at the interface between nitrate, phosphate, and by-product particles in the liquid, which result from chemical reactions. This synergism further contributes to nitrate removal and prolonged phosphate removal through precipitation.

The Langmuir and Jovanovic isotherm models had similar performances when used to describe nitrate and phosphate adsorption in IFGEM and AGEM-1, respectively. However, the performance of the Jovanovic isotherm model decreased for AGEM-2. This suggests that the assumption of mechanical contact between adsorbate and adsorbent in the Jovanovic model is the only assumption that differentiates it from the Langmuir isotherm model.

The Temkin model described nitrate and phosphate adsorption for all media as exothermic. Furthermore, the qmax for the Temkin model was estimated based on the modified Temkin model by substituting $\Delta Q$ with $\Delta H°$ ($b_t = \Delta Q = -\Delta H°$), obtained from the thermodynamic adsorption assessment. Since AGEM-1 was outperformed by the nutrient removal of IFGEM and AGEM-2, qmax for the Temkin model was calculated only for IFGEM and AGEM-2. Although the determined $R^2$ are high, the negative maximum adsorption values suggest that the modified Temkin model may not be appropriate for describing the nitrate and phosphate adsorption of IFGEM and AGEM-2. Further, Elovich had the worst performance due to its inappropriate prediction of maximum adsorption and low correlation values.

TABLE 7

Summary of parameters from Langmuir, Freundlich, First Modified Langmuir, Temkin, and Jovanovic isotherms models for nitrate and phosphate adsorption by different media

| Model | Parameter | IFGEM Nitrate | IFGEM Phosphate | AGEM-1 Nitrate | AGEM-1 Phosphate | AGEM-2 Nitrate | AGEM-2 Phosphate |
|---|---|---|---|---|---|---|---|
| Langmuir | $R^2$ | 0.9992 | 0.9467 | 0.9758 | 0.9764 | 0.93 | 0.6987 |
|  | $q_{max}$ (mg/g) | 0.0393 | 0.0075 | 0.0593 | 0.1926 | 0.0082 | −0.0036 |
|  | $K_l$ | 0.9708 | 339.2 | 1.9397 | 0.7177 | 314.9 | −12.4 |
| Freundlich | $R^2$ | 0.9968 | 0.7962 | 0.9605 | 0.9102 | 0.5426 | 0.8218 |
|  | $K_f$ (mg/g) | 0.0237 | 0.0201 | 0.0602 | 0.1719 | 0.0086 | 2.016 |
|  | n | 1.217 | 2.94 | 1.2416 | 0.9422 | 13.14 | 0.5233 |
| First Modified Langmuir | $R^2$ | 0.9764 | 0.6942 | 0.7356 | 0.0439 | 0.9998 | 0.4135 |
|  | $q_{max}$ (mg/g) | 0.0188 | 0.0072 | 0.0288 | 0.0403 | 0.0076 | −0.0059 |
|  | $K_{ml}$ | 2.0583 | 737.7 | 4.39 | 3.089 | −427.8 | −9.125 |
| Temkin | $R^2$ | 0.9987 | 0.5702 | 0.9917 | 0.9987 | 0.494 | 0.9709 |
|  | $b_t$ (J/mol) | 458809 | 1548482 | 393265 | 458809 | 4955144 | 231548 |
|  | $K_t$ (L/g) | 17.3198 | 2800 | 46.58 | 17.32 | 24154952 | 42.03 |
|  | $q_{max}$ (mg/g) | −0.0132 | −0.0846 | — | — | −0.0188 | −0.0056 |
| Jovanovic | $R^2$ | 0.9676 | 0.9531 | 0.8905 | 0.9627 | 0.1308 | 0.7701 |
|  | $q_{max}$ (mg/g) | 0.0028 | −0.0301 | 0.0036 | 0.0011 | 0.0066 | 1213 |
|  | $K_j$ | −3.7404 | −842.3 | −9.082 | −35.94 | −0.2435 | −38.5 |
| Elovich | $R^2$ | 0.9531 | 0.3196 | 0.4959 | 0.4526 | 0.4189 | 0.679 |
|  | $q_{max}$ (mg/g) | −0.0301 | −0.0054 | −0.0353 | 0.026 | −0.0012 | 0.0103 |
|  | $K_e$ (L/mg) | −842.3 | −184.7 | −227.7 | 350.1 | −16.59 | 1578 |

The isotherm models were categorized via assessment indices according to the multi-criteria selection principles described previously. The applied isotherm models were organized in a descending order from the most appropriate to the least appropriate model for each media mix. The different parameters and correlation factors derived from each model are presented in Table 7. The six models were ranked from the most to the least appropriate for IFGEM in the following order: 1) Langmuir, 2) Freundlich, 3) First Modified Langmuir, 4) Jovanovic, 5) Temkin, and 6) Elovich. The isotherm models were ranked for AGEM-1 as 1) Langmuir, 2) Freundlich, 3) Temkin, 4) Jovanovic, 5) First Modified Langmuir and Elovich, whereas the ranks for AGEM-2 were 1) Langmuir, 2) Freundlich, 3) First Modified Langmuir, 4) Temkin, 5) Jovanovic, and 6) Elovich. Further screening of the most appropriate models for engineering applications are as follows: 1) Langmuir and Freundlich are the most appropriate isotherm models for nitrate and phosphate adsorption.

The inclusion of iron filings and aluminum improved nutrient removal processes. The nitrate and phosphate removal interaction within the media mixes resulted in ammonia production as a byproduct, suggesting that it can be recovered to use as soil amendment. The ratio of around 2.5:1 between iron filings and clay in all three green sorption media (Table 1) was adopted to enhance total nitrogen, ammonia, and phosphorus removal, as this ratio was demonstrated by Valencia et al. (2019a) to perform optimum nutrient removal. Moreover, AGEM-1 and AGEM-2 included aluminum in two different forms (flakes and powder) at different iron filing, clay, and aluminum ratios (2.5:1:2.5 and 2.55:1:1.5). The highest ratio between iron filings and clay corresponds to AGEM-1, which utilizes aluminum flakes (2.5:1:2.5). Remarkably, the AGEM-1 mix performed similarly to IFGEM within the first 5 hours. However, after such time the nitrate removal of AGEM-1 increased, outperforming IFGEM. This result can be associated with the oxidized aluminum coating on the surface of the aluminum flakes that delays the reactions necessary for nitrate reduction to proceed (Erickson et al. 2012). When nitrate oxidation via aluminum occurs, ammonia concentration in the effluent increases (FIG. 6). Furthermore, given that aluminum has a relatively strong reduction property at a high pH (pH>10), AGEM-1 can be studied for its suitability for treating water with a high pH (Erickson et al. 2012). AGEM-2 includes aluminum in the form of powder at a lower ratio (2.5:1:1.5). The performance of AGEM-2 exceeds the nitrate removal and ammonia production of IFGEM and AGEM-1, indicating that aluminum powder performs better than aluminum in flakes. Also, the inclusion of aluminum reacted with nitrate, resulting in higher ammonia production in AGEM-2 and AGEM-1 than in IFGEM, suggesting better availability for ammonia recovery. The increase in nitrate removal in AGEM-2 can also be associated with the increase in iron filing (percent by volume), and the inclusion of aluminum powder in the media. Therefore, different iron filing, clay, and aluminum powder ratios can be studied in the future to account for the ammonia produced by aluminum and nitrate interactions.

All three green sorption media performed similarly regarding phosphate removal, with average phosphate removals of 95.25%, 95.19%, and 96.15% for IFGEM, AGEM-1, and AGEM-2, respectively. The highest phosphate removal was observed within the first 30 minutes of contact time. After 30 minutes, the adsorption of phosphate fluctuated, showing slight sorption and desorption, implying that, after the media reached equilibrium, phosphate started to leach out of the media. However, without the presence of a desorption agent, phosphate was then adsorbed back into the media. These results suggest that phosphate is not a limiting nutrient, since it was absorbed within the first 30 minutes of contact time. The prolonged and high phosphate removal suggests that ammonia resultant as a byproduct from the nitrate reactions may have been utilized in the system to enhance the treatability of phosphate, given that ammonia can react with phosphate into triammonium phosphate.

The nutrient removal in the system is achieved mainly by adsorption/absorption; however other processes can occur in the system, such as precipitation, ion-exchange, and reduction/oxidation, following the equations above. When the media mix is saturated, the nutrients remain in the system, which suggests the potential for the nutrients from the media mixes to be further recovered. Desorption by the addition of a desorbing agent is one of the most utilized methods for nutrient recovery in sorption media. The most popular desorption agent for the recovery of nitrate, ammonia, and phosphate from the spent absorbents is NaOH, $CaCl_2$, KCl or HCl. Moreover, the determination of the appropriate concentration of this reagent is imperative to evade undesired interaction in the system (Guo et al. 2006; Kawasaki et al. 2010). While desorption processes are promising, designing a system that encompasses a desorption process can be challenging and costly in real-world applications. The direct application of saturated media as soil amendment, however, can be a preferable option, as it is simpler. Furthermore, the application of the sorption media as soil amendment (raw media) can be an alternative for conditioning a soil to improve food production. If incorporated in crops, the spent green sorption media can serve as a soil amendment, improving the physical and chemical properties of the rhizosphere zone of the soil while conjointly treating water for nutrient removal (Ryan et al. 2009).

Furthermore, determining the release of aluminum ions through the application of the media mixes is of importance, as human exposure to high concentrations of aluminum can cause detrimental health effects, such as Alzheimer's disease and kidney diseases (McNear Jr 2013; Panhwar et al. 2016). Even though iron is not known to be hazardous to human health, studying its release potential is important for a better implementation of the media, as iron can cause water to appear and taste unpleasant (Panhwar et al. 2016). A column study that analyzed the release of aluminum and iron ions from IFGEM and AGEM-2 mixes helps clarify this concern (Ordonez et al., 2020). The results indicated that the concentrations of aluminum and iron ions released from the media mixes in a sorption process fell well below the safety standard established by the World Health Organization (WHO 1996, 2010; Azizian et al. 2018). Additionally, the toxic effect of microplastic is of concern according to the US EPA, due to the hazard that it may pose to aquatic life (Duis et al. 2016). However, the toxicity of tire crumb has been previously studied by Wanielista et al. 2008 via a lethal concentration for 50% kills (LC50) analysis with fathead minnows. The relative acute toxicity of a material added to an environment at the end of a short period of time was studied; tire crumb, when tested with tap and distilled water, was found to be nontoxic, leading to the conclusion that the application of recycled tire crumb is acceptable.

The kinetics, thermodynamics, and equilibrium characteristics of the media mixes were obtained by inserting the data into the isotherm and kinetics models presented above. The results from the kinetic assessment indicated that nitrate removal in the media mixes is better represented by pseudo-first-order kinetics. This suggests that the adsorption mechanism for nitrate was driven by the large nitrate concentration in the liquid in comparison to the other chemicals. Thus, the mechanism is a result of the proportional relation between the number of adsorption sites and the adsorption rate (Hamoudi and Belkacemi 2013), with dependence on one primary reactant in the reaction, such as nitrate. In contrast, phosphate removal by the media mixes was better represented by the pseudo-second order kinetics. This suggests that the phosphate adsorption process for the media mix was controlled by chemisorption, related to the valency forces between phosphate and the adsorbent (Huang et al. 2008). The pseudo-second-order kinetics have also been observed to more appropriately describe phosphate adsorption in red mud (Huang et al. 2008), dolite (Karaca et al. 2004), and magnetic iron oxide nanoparticles (Yoon et al. 2014). Furthermore, the negative values for some kinetics coefficients in Tables 6-7 suggest that the reactants are being used up (or decreasing) as a result of the chemical reactions, while the low kinetic coefficient suggests a slower reaction rate.

The results of the thermodynamics adsorption assessment indicate that the IFGEM nutrient removal reactions were exothermic, while the nitrate removal in AGEM-2 was endothermic, and phosphate removal was mostly exothermic. The difference in thermic reactions for nitrate removal for IFGEM and AGEM-2 can be associated with the difference in the material composition of the media mixes, since metal cation adsorption has been described as endothermic (Machesky, M. L. 1990). AGEM-2 has a higher content of metals, and thus the results suggest that metal cation adsorption played a big role in the adsorption of nitrate, given that endothermic reactions prevailed. Furthermore, the $\Delta S°$ values indicated that AGEM-2 had better affinity for nitrate adsorption, while $\Delta G°$ implied that phosphate removal reactions in both media (IFGEM and AGEM-2) were spontaneous and favorable. This difference between nitrate and phosphate adsorption reactions suggests that phosphate adsorption is more likely to occur, and more feasible, than nitrate adsorption. This substantiates the nutrient removal findings, in which phosphate had a higher removal than nitrate (FIG. 5). Hence, phosphate was removed mainly by adsorption processes, while nitrate adsorption was limited and, in turn, promoted nitrate oxidation, producing ammonia. Overall, the thermodynamic results indicate that the most favorable phosphate adsorption occurred for both media mixes at all conditions given the spontaneity of the nutrients' adsorption in the media.

The equilibrium assessment indicated that the Langmuir and Freundlich isotherm models better described the performance of the media mixes IFGEM and AGEM-1, while the First Modified Langmuir and Freundlich model described AGEM-2 well. The high correlation value exhibited by Freundlich can suggest multi-layer adsorption with reverse adsorption, which can be associated with the prolonged adsorption of phosphate.

The efficiency of applications of previous green sorption media at the field scale has been confirmed in diverse engineering systems. Studies of BAM at linear ditch scale along a road site near a dairy farm indicated favorable results for nutrient removal, principally nitrate and phosphate, via different biogeochemical processes (Chang et al. 2018b; Chang et al. 2019). The functionality of BAM not only maintains moisture content for biomass growth but also tunes the water infiltration rate to provide essential HRT and support nutrient removal (Wen et al. 2019a; 2019b). BAM mix was also applied to a rapid infiltration basin to treat reclaimed wastewater and stormwater alternately, and better nutrient treatability (83 to 95% nitrate removal) was confirmed in comparison to a traditional soil infiltration basin (40 to 90% nitrate removal) (Cormier et al. 2020; Wen et al. 2020b). These findings from a suite of real-world applications signify the application potential of IFGEM and AGEM once the material characterization and reaction mechanisms can be fully realized in the above sections.

Conclusion

Nutrient removal and adsorption capacity were explored for IFGEM and two types of AGEM, both containing iron and aluminum in their recipes. This analysis ultimately confirms that AGEM, and particularly AGEM-2, is a new green sorption media that can remove and recover nutrients and with the highest efficiency so far for future agriculture crop production as soil amendments. Within 7 hours, AGEM-2 can remove over 80% nitrate and 90% phosphate. Also, this media mix shows potential for field implementations as a soil amendment in agriculture crop production, linear ditch systems, retention ponds, or constructed wetlands. It was found that the inclusion of aluminum powder in the media increased the nutrient removal and recovery potential of AGEM-2. However, the inclusion of aluminum in flakes in AGEM-1 was less effective in comparison to the aluminum powder in AGEM-2 due to the oxidizing coating on the aluminum flakes' surface that delayed the reaction. Yet, once the aluminum started to react, the removal of AGEM-1 increased.

The ammonia resultant as a byproduct of the nitrate reduction via iron filings and aluminum in both AGEM make it a very promising soil amendment that can be applied for food production in urban farming. Although ammonia, which may be recovered as soil amendment for reuse, was generated in all media, it is noticeable that more ammonia was generated in AGEM-2 and AGEM-1 in comparison to IFGEM.

The physical changes caused by the difference in the recipe of AGEM-2 produced a decrease in hydraulic conductivity and an increase in its surface area. Such changes can also contribute to improved nitrate removal, given that more time and a higher surface area provide a more suitable environment for the reaction to occur. Surface area also increased in AGEM-2, as powdered aluminum was used in comparison to the larger particles of aluminum flakes in AGEM-1. As the physical properties of iron filings did not differ between AGEM recipes, it can be determined that the increase in aluminum surface area enhanced nitrate removal.

With the purpose of characterizing the media mixes and then obtaining information on the maximum adsorption capacity, the data set was applied to 2 kinetics models, Gibbs free energy, and 6 isotherm equilibrium models. The results indicated that nitrate follows pseudo-first order of kinetics, while phosphate adsorption follows pseudo-second order of kinetics. The Gibbs free energy model indicated that the majority of the adsorption reactions were exothermic, and the Temkin model supports this idea, given that the determined $b_t$ were positive. Furthermore, the equilibrium models were evaluated and ranked according to three indices, and the three best models were selected and ranked as: Langmuir>Freundlich>First modified Langmuir. Lastly, it was observed that the modified Temkin model is not applicable for the prediction of maximum adsorption ($q_{max}$).

Furthermore, green sorption media have the ability to maintain moisture to aid the growth of biofilm, resulting in an incremental improvement in nutrient removal at the field scale. However, previous studies of BAM indicated that different external constituents like carbon and copper can affect the biofilm growth, resulting in an increase or decrease of nutrient removal efficiency. Consequently, future studies on the effect that iron and aluminum, as components of the media, have on biofilm growth should further be explored to obtain a holistic view of the biophysiochemical sorption processes and field capacities of the green sorption media mixes in different conditions.

Example 2—Methods

IFGEM and AGEM-2 were analyzed for their nutrient sorption and recovery potential. IFGEM is composed of 83% sand, 5% iron filing, 10% tire crumb, and 2% clay (by volume), whereas AGEM-2 consists of 85% sand, 7.5% tire crumb, 4.5% aluminum powder, and 3% clay (by volume). Media samples were delivered to EMSL Analytical, Inc. laboratories to measure their density ($g \cdot cm^{-3}$), surface area ($m2 \cdot g^{-1}$) via the Brunauer-Emmett-Teller test, and grain size distribution using a sieve analysis. Further, porosity (%) and hydraulic conductivity ($cm \cdot s^{-1}$) were measured in the Geotechnical Laboratories at the University of Central Florida.

A tracer study for measuring hydraulic retention time (HRT) with rhodamine dye was conducted on IFGEM and AGEM-2 mixes to characterize the internal hydraulic pattern of the media. Rhodamine dye was selected for this study because of its relatively low cost, no natural background concentration, and low detection ranges (Chang et al. 2012). To begin the analysis, 90 µL of rhodamine dye was injected in the middle of the top section of each column. Subsequently, the dye concentration of the water samples collected from the effluent was analyzed and recorded using an AquaFlour™ fluorometer.

Figure 7:
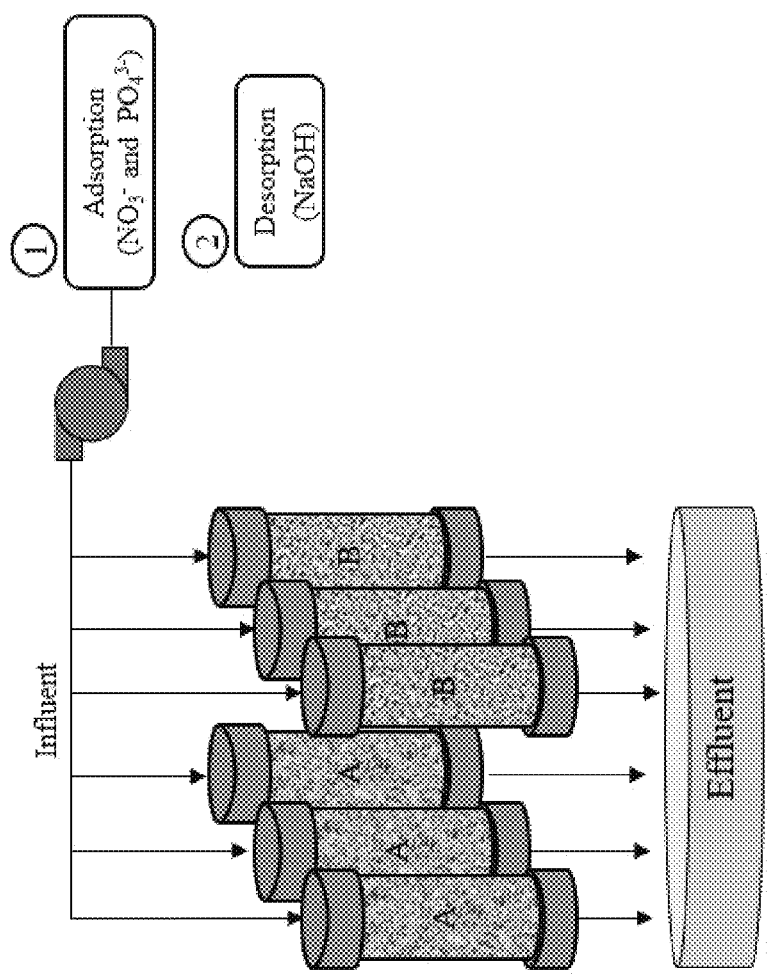
FIG. 7 depicts a plurality of filtration chambers including different filtration media disposed therein, in accordance with an embodiment of the present invention.

Six fixed-bed columns, each 1 foot high and 2 inches in diameter, were assembled for this comparative study. The columns (in triplicate) were filled with 500 grams of IFGEM and AGEM-2 media, respectively, with a layer of crystal pebbles placed at the top of each column to aid in water distribution. Similarly, a layer of crystal pebbles and a filter were placed at the bottom of each column to prevent clogging of the effluent. The filtration media is shown in FIG. 7 (with a similar setup used for Example 1).

Each column was supplied with a constant flowrate of 3 $mL \cdot min^{-1}$ of distilled water, spiked with nitrate and phosphate at a concentration of 2 $mg \cdot L^{-1}$ of $NO_3^-$ and 2 $mg \cdot L^{-1}$ of $PO_4^-$, aimed to simulate high nutrient loaded stormwater, until breakthrough for either nutrient was observed. Influent and effluent water samples were collected at various time intervals during the study for analysis. Each water sample was analyzed in triplicates via HachTNT, plus vials for total phosphorus (TNT 843), nitrate (TNT 835), and ammonia (TNT830). The detection ranges fell between 0.15-4.50 mg $PO_4^- \cdot L^{-1}$, 0.2-13.5 mg $NO_3^- - N \cdot L^{-1}$, and 0.015-2 mg $NH_3 - N \cdot L^{-1}$ for total phosphorus, nitrate, and ammonia, respectively. If the effluent concentrations reported were above the detention ranges, 10-fold dilutions were applied to the water samples. Further, the oxidation-reduction potential (ORP), dissolved oxygen (DO), and pH were measured with HACH HQ40D-IntelliCAL LDO101 LDO, IntelliCAL, and the Waterproof Double Junction pH Test® 30, respectively. To account for the possible health risks caused by excess leakage of aluminum and iron ions, effluent water samples were collected and analyzed every 24 hours for the first five days, and afterwards every 72 hours until the completion of the adsorption process. Similarly, Hach TNT plus vials of aluminum (TNT 848) and iron (TNT 858) were utilized to measure these parameters.

The removal process is a combination of absorption, adsorption, reduction-oxidation, ion exchange, and precipitation. The chemical reactions corresponding to the nutrient removal and recovery process of the fixed-bed column study unique to each media were explored and delineated in continuation. The primary distinction between the IFGEM and AGEM-2 media is the inclusion of aluminum in the AGEM-2 mixture, which further enhances nutrient removal. Incorporating aluminum into the media mix enhances the properties of the mix, enabling it to interact with various compounds. In theory, the presence of both iron and aluminum provides high precipitate formation, benefiting and increasing nutrient removal. Iron filing particle interactions promote the formation of phosphate precipitates such as iron (II) phosphate and iron (III) phosphate, as described in the equations above in Example 1. In addition, iron assists in the reduction of nitrate to ammonia when in contact with clay particles. However, the presence of aluminum can provide further phosphorus removal by producing aluminum phosphate precipitate, a compound found in nature as the mineral berlinite (Vippola et al. 2002).

Normally, aluminum does not instantly react with water due to the existence of a protective layer of alumina ($Al_2O_3$) composed of aluminum oxide, which reduces the chemical interaction (Rosenband and Gany 2010). Once this layer dissipates, the aluminum can react in various chemical reactions. In the case of aluminum powder, oxidation with air occurs as described in Antipina et al. 2017. However, aluminum powder is combustible and flammable with a risk of igniting when in contact with air at high temperatures (Gromov and Vereshchagin 2004). Additionally, aluminum nano powders react to produced hydrogen upon contact with water (Antipina et al. 2017), and this release forms a subsequent reaction in water that can produce combustion. Further, aluminum oxide can also be produced from the interaction between aluminum and water vapor (Franzoni et al. 2010).

On the other hand, precipitates like aluminum hydroxide salts can be produced through the interaction of aluminum with nitrate. This interaction can proceed as two separate reactions, to produce either ammonium that remains in the system, or nitrogen gas that can exit the system (Luk and Au-Yeung 2002). Further, in an aqueous solution aluminum dissociates to form an aluminum hydroxide compound that can further react with acidic or basic species, as aluminum is an amphoteric metal (Sun et al. 2019). This reaction proceeds at temperatures less than 70° C. (Razavi-Tousi and Szpunar 2013). Aluminum hydroxide dehydration forms $Al_2O_3$ (Du et al. 2009), which is also a reactant in the formation of ammonium dihydrogen phosphate (ADP) and diammonium hydrogen phosphate (DAP).

The formation of other salts via precipitation, like ADP and DAP, in the presence of aluminum, phosphate, and ammonia can be applied in soil as supplements for fertilizers (McGowen et al. 2001; Thawornchaisit and Polprasert, 2009; Jiao et al. 2012). It is known that mineral-bound Fe(II) species become important natural reductants of pollutants in the anaerobic subsurface, and three types of Fe(II) species, such as structural Fe(II), Fe(II) bound by ion exchange, and Fe(II) complexed by surface hydroxyl groups, can be present simultaneously as clay minerals (Hofstetter et al. 2003). Moreover, aluminum and iron oxides can stabilize clay minerals by: 1) decreasing critical coagulation concentration, 2) reducing clay dispersion, 3) mitigating water uptake, 4) minimizing clay swelling, and 5) increasing micro-aggregation to trigger a collective effect for nutrient removal and recovery (Goldberg 2008). The mechanisms in the equations in Example 1 contribute to the synergistic effects of aluminum and iron oxides, and clay minerals in green environmental media for nutrient removal and recovery collectively.

Additionally, the presence of magnesium, a metal contaminant in stormwater (Scarlett et al., 2018), can contribute to the generation of struvite precipitate formed among magnesium, ammonium, and phosphate in water. This is important, as struvite crystallization has transitioned from being regarded as a nuisance to a form of phosphorus recovery in wastewater treatment based on its fertilizing properties (Le Corre et al. 2009). Hence, each of the media components is interrelated and interdependent, affecting the transformation, removal, and recovery of nutrients through a suite of key chemical reactions.

Furthermore, to discern the viability and practicality of adsorption media regeneration for reutilization, the columns underwent a desorption process, which was applied to the saturated media. After the saturation process (adsorption) and before the desorption process, the columns were left to drain for 24 hours, and 30 g samples were collected from the top of the columns for media analysis. The desorption process consisted of feeding the saturated media with 1% NaOH solution at a flowrate of 3 mg·L$^{-1}$ for IFGEM and 2 mg·L$^{-1}$ for AGEM-2. Samples were collected at appropriate time intervals until the effluent concentration reached equilibrium. The collected effluent samples were analyzed, as mentioned previously, for total phosphorus, nitrate, ammonia, ORP, DO, and pH. Similarly, 30 g of media were collected for media analysis during desorption.

To obtain information on the dynamic behavior of the media, data retrieved from the column study were applied to six models, including the Bohart-Adams (B-A), Modified Dose Response (MDR), Thomas, Yoon-Nelson, Wolborska, and Wang models. The B-A model was originally developed to describe the gas-charcoal sorption system; however, it has been successfully applied to other adsorption systems (Hamdaoui 2006). The B-A model assumes pseudo-first order reversible reaction kinetics and symmetrical breakthrough curves (Chang et al. 2016a); its non-linear and linear forms are presented in Equations 15 and 16.

$$\frac{C_t}{C_o} = \frac{1}{1+\exp\left(K_{BA}\left(\frac{q_o m - C_o V}{Q}\right)\right)} \quad (151)$$

$$\ln\left[\left(\frac{C_0}{C_t} - 1\right)\right] = \frac{K_{BA} q_o m}{Q} - K_{BA} C_0 t \quad (16)$$

The constant $K_{BA}$ s the B-A rate constant in mL·mg$^{-1}$·min$^{-1}$, and $q_0$ (mg·g$^{-1}$) is the media equilibrium uptake. Both constants can be calculated from the linear regression of the plot $$\ln\left(\frac{C_t}{C_o} - 1\right) vs. t$$

The parameters $C_o$, $C_t$, m, Q, V, and t were retrieved from the column study, and they correspond to the influent concentration (mg·mL$^{-1}$), effluent concentration (mg·mL$^{-1}$), mass of media in the column (g), flow rate (mL·min$^{-1}$), quantity of volume (mL), and time from the beginning of sorption process (t), respectively. The constants $C_o$, $C_t$, m, Q, V, and t possess the same meaning and units in the different models utilized in this study.

The MDR model is an empirical model, and thus it does not assume a specific kinetic reaction (Chang et al. 2016b). It can be applied to sorption processes where the breakthrough curves demonstrate asymmetric behavior (Chang et al. 2016a). Furthermore, the MDR model can be used to minimize the error from the Thomas model at lower and higher time periods of the breakthrough curve (Yan et al. 2001, Zhao et al. 2014). The non-linear and linear forms of the MDR equation are presented in Equations 17 and 18.

$$\frac{C_t}{C_o} = 1 - \frac{1}{1+\left(\frac{C_o Q t}{q_o m}\right)^{a_{mdr}}} \quad (17)$$

$$\ln\left(\frac{C_t}{C_o} - 1\right) a_{mdr}\ln(C_O Q t) - a_{mdr}\ln(q_o m) \quad (182)$$

The constants $a_{mdr}$ and $q_o$ correspond to the MDR model constant in mL·mg$^{-1}$·min$^{-1}$ and the equilibrium media uptake in mg·g$^{-1}$, respectively. They can be calculated from the linear regression of the plot $$\ln\left(\frac{C_t}{C_o} - 1\right) vs. \ \ln(C_O Q t),$$

wherein the $q_o$ value can be utilized to approximate the life expectancy of the media.

The Yoon Nelson model is one of the simplest models, as it does not require detailed information regarding the adsorbate, adsorbent, or the physical characteristics of the sorption bed (Crhribi and Chlendi 2011). The model is presented as Equation 19, and its linearized form follows in Equation 20.

$$\frac{C_t}{C_o - C_t} = \exp(k_{YN} t - \tau k_{YN}) \quad (19)$$

$$\ln\left[\left(\frac{C_t}{C_{O-C_t}}\right)\right] = K_{YN} t - \tau k_{YN} \quad (20)$$

The constant $k_{YN}$ corresponds to the rate constant in minutes$^{-1}$, and τ is half the time (mins) required for the adsorbate to reach the breakthrough. The constants $k_{YN}$ and T can be retrieved from the linear regression of the plot $$\ln\left[\left(\frac{C_t}{C_0 - C_t}\right)\right] vs. t$$

The Thomas model was developed based on second order reversible reaction kinetics and the Langmuir isotherm model. It is one of the most general and frequently used models employed to predict adsorption capacity and breakthrough curves (Ebrahim and Mustafa 2010, Xu et al. 2013). It is normally adequate for modeling an adsorption process where external and internal diffusion is considered minimal (Ghasemi et al. 2011). The general form of the Thomas model follows in Equation 21, $$\ln\left[\left(\frac{C_o}{C_e}\right) - 1\right] = k'(t - t_1) \quad (21)$$

where k'=$K_T C_o$ and $t_1$=$q_o m \cdot (Q C_F)^{-1}$. Thus, through substitution and linearization, the Thomas model follows Equation 22:

$$\ln\left[\left(\frac{C_0}{C_t} - 1\right)\right] = \frac{K_T q_o m}{Q} - K_T C_0 t \tag{22}$$

The constant $K_T$ is the Thomas rate constant in $mL \cdot mg^{-1} \cdot min^{-1}$, and $q_0$ is the equilibrium media uptake or maximum adsorption capacity; both constants are derived from the linear regression of $$\ln\left[\left(\frac{C_o}{C_t}\right) - 1\right] vs. t.$$

Similarly, in the B-A and MDR models, the $q_0$ value allows the calculation of the life expectancy of the media.

The Wang model assumes isothermal processes, symmetrical breakthrough curves, and negligible axial dispersion. It assumes that the sorption capacity of the soil is proportional to the sorption rate (Araneda et al. 2011). The nonlinear and linear equations follow in Equations 23 and 24.

$$\frac{C_t}{C_o} = 1 - \frac{1}{1 + \exp(K_w(\tau - t))} \tag{233}$$

$$\ln\left[\left(\frac{C_0}{C_t} - 1\right)\right] = K_w(\tau - t) \tag{24}$$

The constant Kw corresponds to the Wang kinetic constant in $minutes^{-1}$, and $\tau$ is the time in mins required for 50% sorption. The constants $K_w$ and $\tau$ are retrieved from the linear regression plot of $$\ln\left[\left(\frac{C_o}{C_t}\right) - 1\right] vs. t.$$

The Wolborska model was developed based on the equation of mass transfer to describe the breakthrough curve at low concentrations. The linear equation is described in Equation 25 (Trgo et al. 2011, Wolborska 1989):

$$\ln\left[\left(\frac{C_t}{C_o}\right)\right] = \frac{\beta_a C_o t}{q_o} - \frac{\beta_a H}{v} \tag{25}$$

$\beta_a$ is the kinetic coefficient of the external mass transfer in $min^{-1}$, H corresponds to the bed depth in meters, and v is the linear flow velocity in $m \cdot min^{-1}$. The constants $\beta_a$ and $q_o$ can be determined for the linear regression of $$\ln\left[\left(\frac{C_o}{C_t}\right) - 1\right] vs. t.$$

Media samples from the top section of each column were collected and dehydrated at 52° C. for 36 hours. Subsequently, photographs of the media samples were taken via a JEOL JSM-6480 Scanning Electron Microscope (SEM) from the Advanced Material Processing and Analysis Center located at the University of Central Florida. The SEM photographs provide an optimal visualization of media samples, as they allow the characterization of non-conductive samples and permit the modification of brightness, contrast, stigmatism, and gun alignment.

Results

Figure 8:
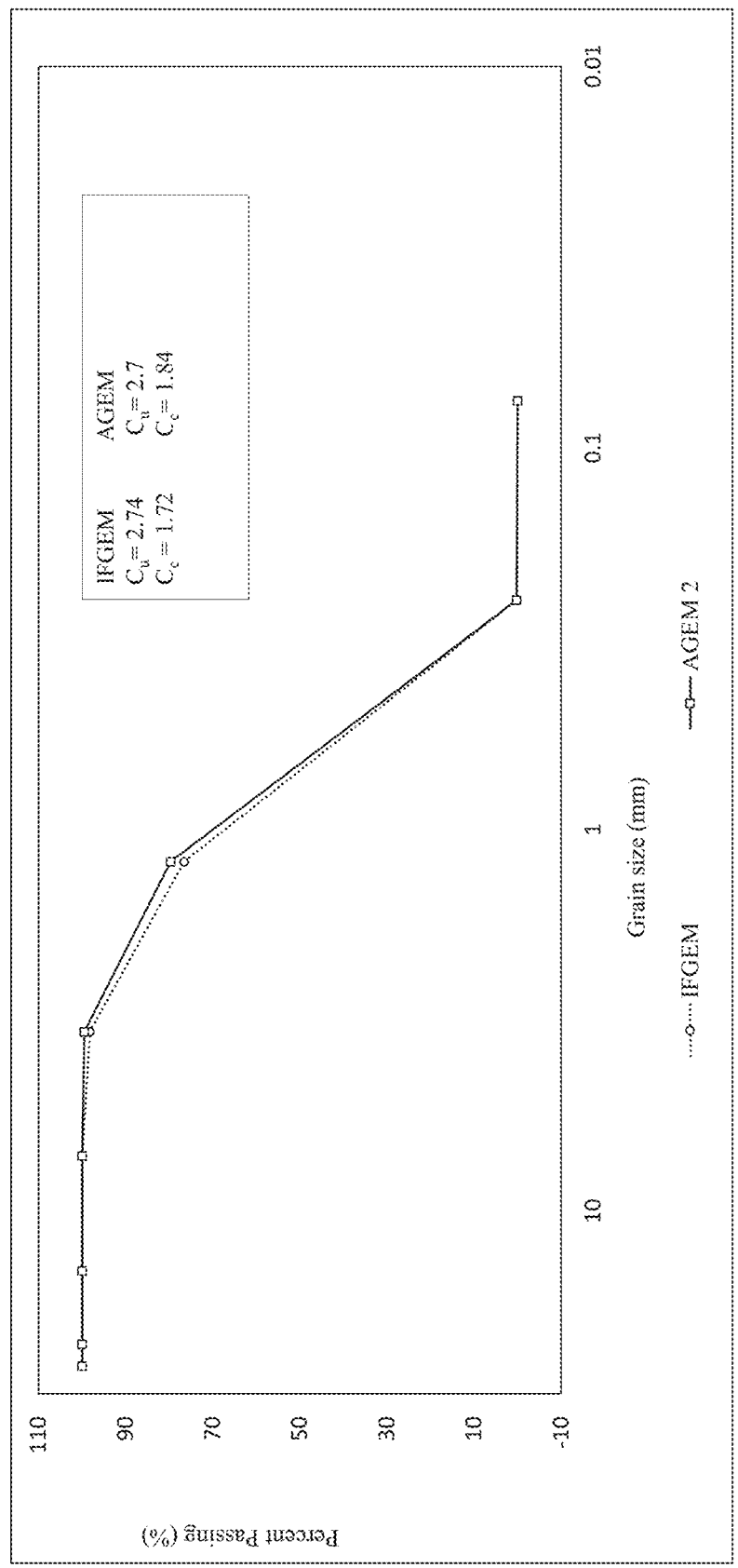
FIG. 8 is a graphical representation of sieve analysis distribution for two different filter media.
Figure 9:
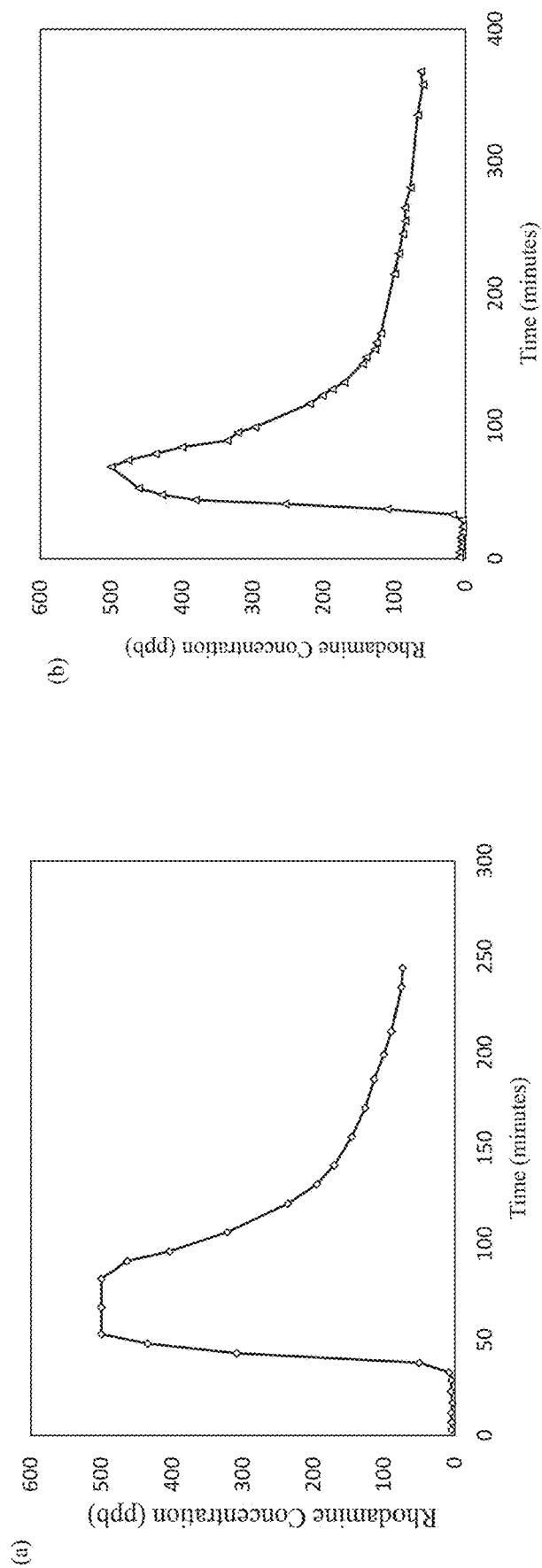
FIG. 9 graphically depicts tracer study results for different filter media.

The physical characteristics and properties of the media can provide insight to their performance in the adsorption-desorption process. The particle size distribution of the media and the corresponding coefficients are displayed in FIG. 8. The uniformity coefficient ($C_u$), indicates that both mixes are uniformly graded, suggesting that the particle sizes within the media are similar. Moreover, the $C_u$ specifies that IFGEM has a higher range of particle sizes. The media characterization analysis reveals the AGEM-2 mix to have a surface area of 1.71 $m^2 \cdot g^{-1}$, porosity of 29.1%, bulk density of 1.52 g·cm-3, and hydraulic conductivity of 0.027 cm·s-1. In contrast, the IFGEM mix has a surface area of 0.7 m2·g-1, porosity of 25.5%, bulk density of 1.37 $g \cdot cm^{-3}$, and hydraulic conductivity of 0.031 $cm \cdot s^{-1}$. This indicates that AGEM-2 has more than twice the surface area of IFGEM, a characteristic acquired from the inclusion of aluminum powder particles in the mixture. The hydraulic retention time was estimated via a tracer study for the AGEM-2 and IFGEM mixes, and the results are displayed in FIG. 9. Given that for the IFGEM mix the dye concentration exceeded the detection limit during the observed peak, the hydraulic retention time in minutes was estimated by taking the average time of the highest concentrations recorded, resulting in an HRT of 67.5 minutes, while the HRT for the AGEM-2 mix was observed at 69 minutes. The outcomes of the media characterization and tracer study indicate that the AGEM-2 mix exhibits higher surface area, porosity, and bulk density, in comparison to the IFGEM mix. Furthermore, the AGEM-2 mix exhibits a slightly longer hydraulic conductivity and HRT in comparison to the IFGEM mix. Given that the difference in the HRT values is small, the sorption media can be inferred to be comparable, although differences between individual media characteristics can additionally impact adsorption and desorption processes.

The measured water characteristics of the treated influent reflect the effects of the chemical and physical interactions of each media. The average values of pH, DO ($mg \cdot L^{-1}$), and ORP (mV) for the IFGEM mix throughout the sorption process are 7.98±0.31, 9.41±0.5, and 245.9±38.6, respectively. Furthermore, the pH, DO ($mg \cdot L^{-1}$), and ORP (mV) for AGEM-2 are 8.08±0.49, 9.42±0.5, and 240.63±67.12, respectively. The pH values ranged from neutral to slightly alkaline, while DO values within the sorption process fell between 9-10 $mg \cdot L^{-1}$, indicating good freshwater conditions. The positive ORP values in the effluent show the slight oxidizing potential of the effluent.

Figure 10A:
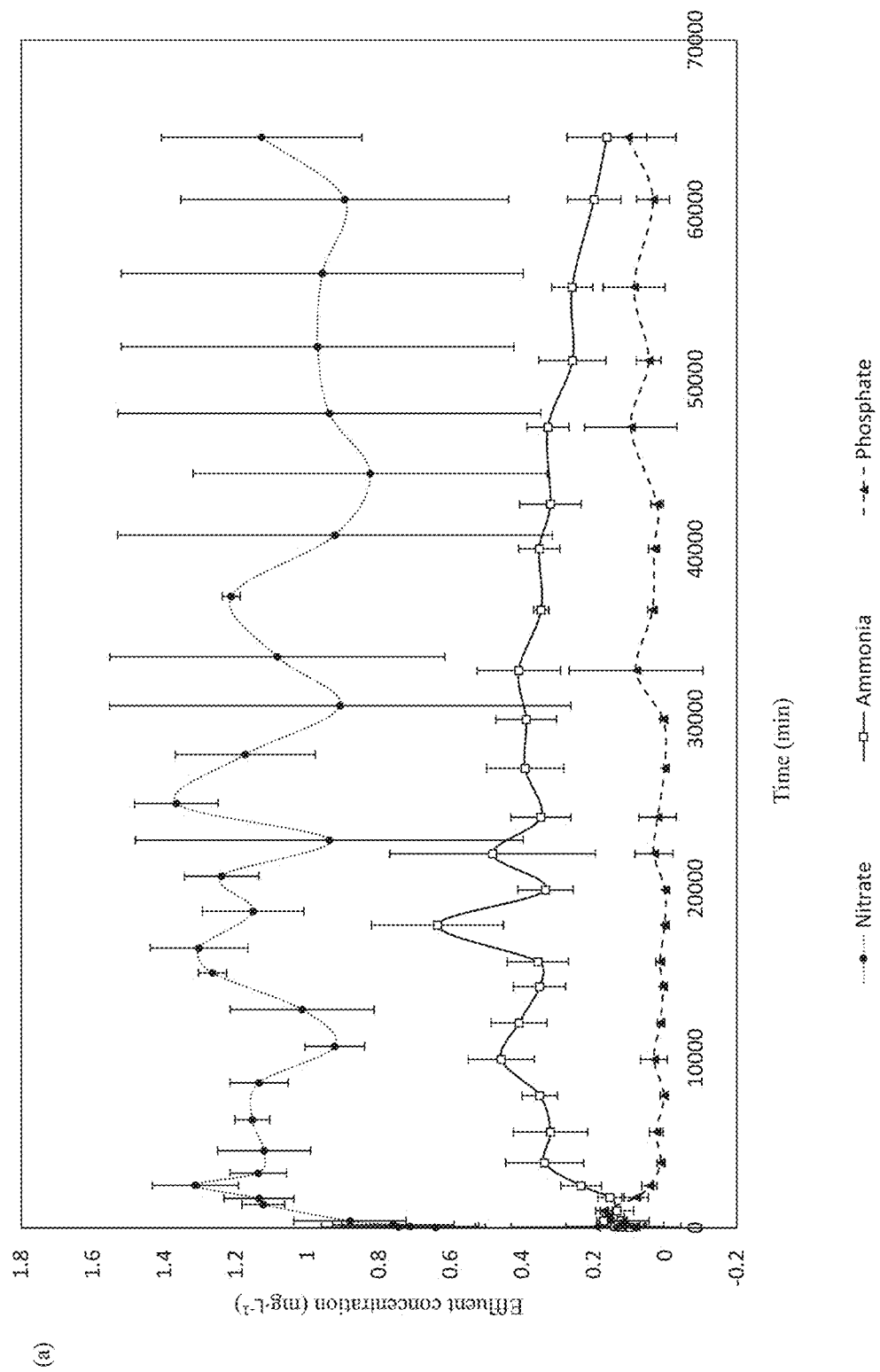
FIG. 10A is a graphical depiction of time series nitrate, ammonia, and phosphate effluent concentrations for an iron-filing-based filter medium.

The nitrate, phosphate, and ammonia sorption curves recorded from the IFGEM mix are presented in FIG. 10A. It can be observed that the highest decrease in nutrient sorption occurs within the first 42 hours of the sorption process, and after 42 hours the change in nitrate sorption varies. However, a high standard deviation is observed on the latest points of the sorption curve, despite the fact that the same mixture was utilized to fill each column. This phenomenon can be associated with media heterogeneity. Furthermore, ammonia was produced within the first 297.5 hours, and afterwards the media started to adsorb the ammonia produced. The release of ammonia at the beginning of the sorption process results from the reduction of nitrate through the iron chemical reactions that are predominant at the beginning of the process; these reactions produce more ammonia than the media can uptake. Once the reactions slow down, the ammonia production decreases, implying that the media have a better capability to regulate ammonia release. Remarkably, phosphate was highly adsorbed throughout the sorption process. Although phosphate removal from precipitation formed from iron interaction is presumed, such a high removal of phosphate can be a product of the chemical interaction with ammonium, resulting in ammonium phosphate salts. This also explains the reduction of ammonia towards the end of the sorption curves.

Figure 10B:
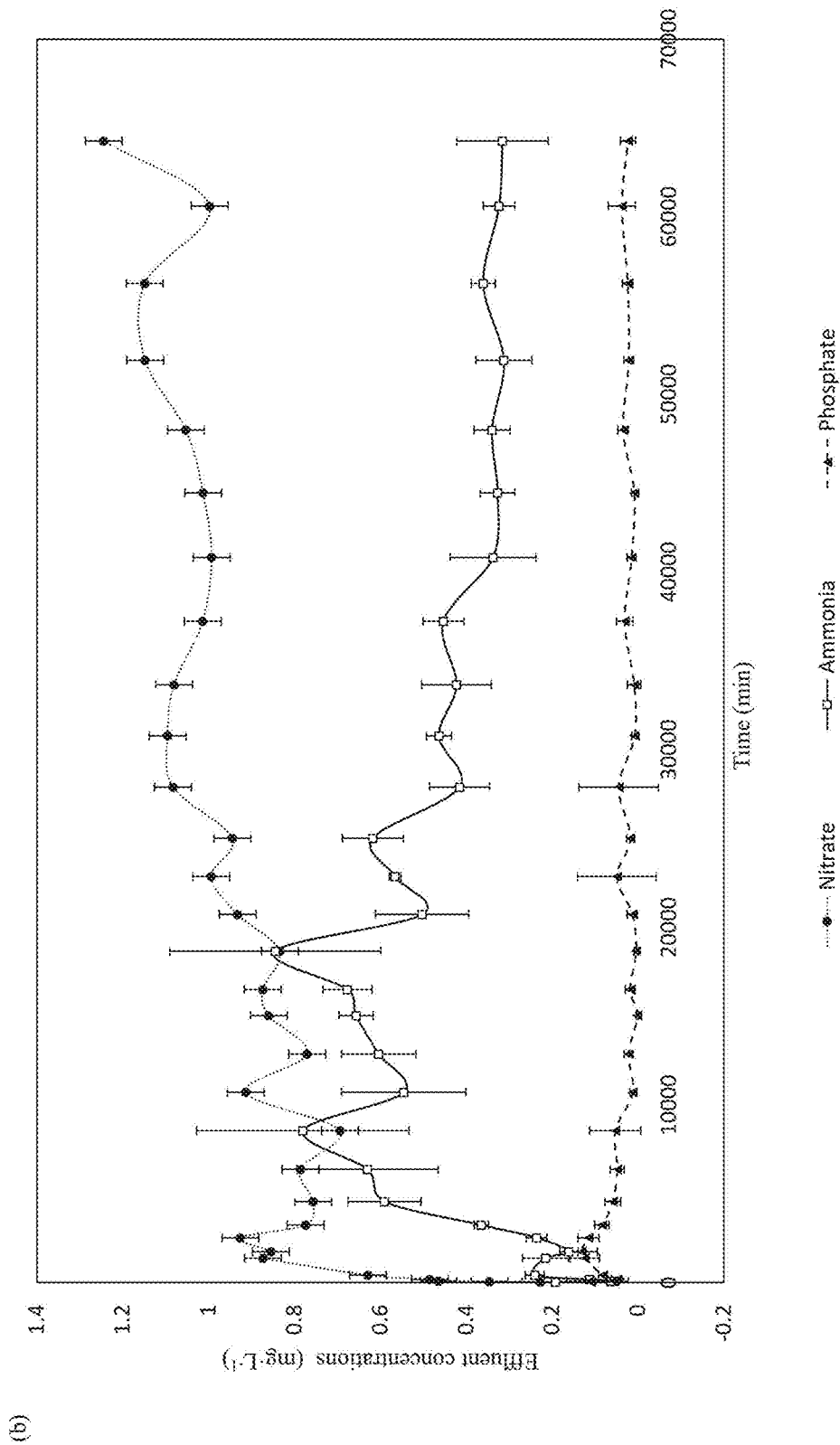
FIG. 10B is a graphical depiction of time series nitrate, ammonia, and phosphate effluent concentrations for an aluminum-based filter medium.

The AGEM-2 sorption curves presented in FIG. 10B depict similar trends. However, the nitrate removals were higher, resulting in higher ammonia production in comparison to IFGEM. This implies that aluminum in the mix reacted with nitrate, causing the large quantity of ammonia observed. Lower standard deviations of the measurements were observed, partially due to the lower range of particle size (FIG. 8) in comparison to IFGEM. The lower range of particle sizes in the AGEM-2 mix allows a better homogeneity of the media, causing similar reactions to occur in all the columns. Moreover, similarly to the IFGEM media sorption curves, the nitrate reduction reactions slowed down, ammonia release decreased, and optimal phosphate removal was observed throughout the sorption process.

Thus, the results obtained by the sorption curves of IFGEM and AGEM-2 assist in rejecting the hypothesis of competitive sorption between nitrate and phosphate, and instead suggest complementary sorption processes. Phosphate removal benefits from the nitrate reduction byproduct (ammonia) produced through iron or aluminum interactions. Ammonia forms precipitates with phosphate-producing ammonium phosphate salt that, if recovered, can be applied in the field to substitute or complement fertilizers. Furthermore, results suggest that all the formed phosphate precipitates contributing to phosphate removal can be intercepted by the media. Consequently, the void space will accumulate the precipitate, inhibiting it from leaving the system, and allowing continual interaction for prolonged phosphate removal by facilitating the acquisition of ammonia in the saturated media.

Figure 11:
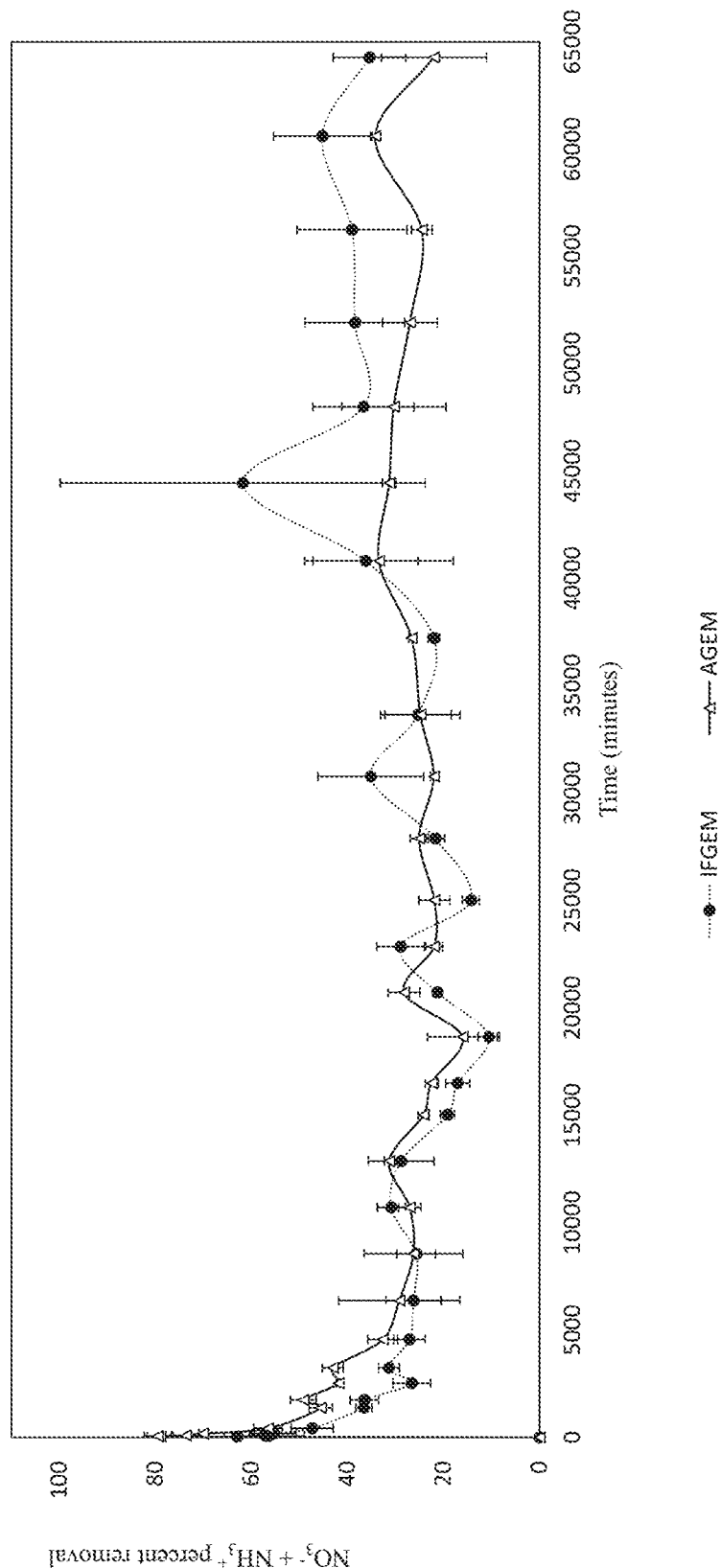
FIG. 11 graphically represents nitrate+ammonia percent removals for different filter media.

Given that nitrite concentration was assumed to be of negligible quantity, the percent removal of nitrate plus ammonia in the time series is presented in FIG. 11 as total nitrogen removal. AGEM-2 outperformed IFGEM up until 20,730 minutes, when the removal increased for IFGEM. The highest TN percent removal by AGEM-2 was reached after 60 minutes of contact time with a removal of 80%, while the highest percent removal of IFGEM occurred after 30 minutes of contact time with a TN removal of 63%. Furthermore, towards the end of the study a higher removal was observed by IFGEM, along with a higher standard deviation within triplicates, exhibiting less reliability than AGEM-2. For comparison, a summary of the differences between the removal efficiencies of the sorption media of this study and those of previous studies are presented in Table 8. It should be noted that the total nitrogen (TN) removal of IFGEM from this study was lower in comparison to previous studies, as less media mix was utilized for the purpose of a faster exhaustion of the media. Overall, the TP (total phosphorus) and TN removal efficiencies of AGEM-2 were higher or in similitude to the other sorption media, supporting the importance of aluminum in the media mixture.

TABLE 8

Comparative removal efficiencies between different sorption media

| Sorption Media | Composition | Ammonia Removal | TP Removal | TN Removal | Nitrite Removal | Nitrate Removal | NOx | Reference |
|---|---|---|---|---|---|---|---|---|
| BAM | 85.0% sand (volume) 10.0% tire crumb (volume) 5.0% clay (volume) (Fixed-bed column studies) | (−127)-14% | 60% | 42-51% 52-80% (ground water) 62-70% | — | — | 72% | Hood et al. (2013); Chang et al. (2018a); Wen et al. (2018) |
| | 75.0% expanded clay (volume) 25.0% tire crumb (volume) (Test bed roadside Swale study) | — | 71% | — | — | — | — | Hood et al. (2013) |
| | 59.0% sand (volume) 14.0% tire crumb (volume) 26.0% clay (volume) (Stormwater dry ponds) | 65.7% | — | 69% | — | 34.6-96.9% | — | O'Reilly et al. (2012b) |
| | 10.0% sawdust (volume) 45.0% tire crumb (volume) 45.0% expanded clay (volume) (Stormwater wet ponds) | — | 25-83% | 17-47% | — | — | — | Ryan et al. (2010) |

TABLE 8-continued

Comparative removal efficiencies between different sorption media

| Sorption Media | Composition | Ammonia Removal | TP Removal | TN Removal | Nitrite Removal | Nitrate Removal | NOx | Reference |
|---|---|---|---|---|---|---|---|---|
| | 15.0% sawdust (volume) 15.0% tire crumb (volume) 20.0% limestone (volume) 50.0% sand (volume) (Fixed-bed column study) | 64-100% | >99% | — | — | 65.4-98.72% | — | Hossain et al. (2010) |
| IFGEM-1 | 96.2% sand (volume) 3.8% iron filing (volume) (Fixed-bed column study) | — | 45%-80% | — | — | 85%-90% | — | Chang et al. (2018b) |
| IFGEM-2 | 80.0% sand (volume) 10.0% tire crumb (volume) 5% clay (volume) 5.0% iron filing (volume) (Fixed-bed column study) | — | 85% | — | — | 61%-92% | — | Chang et al. (2018b) |
| IFGEM | 83.0% sand (volume) 10.0% tire crumb (volume) 2% clay (volume) 5% iron filing (volume) (Fixed-bed column study) | — | 97% | 63% | — | 47% | — | This Study |
| AGEM-2 | 85.0% sand (volume) 3.0% clay 7.5% iron filing 4.5% aluminum powder | — | 98% | 80% | — | 52% | — | This Study |
| SCL (Sandy Clay Loam) | Sandy clay loam (Fixed-bed column study) | — | — | — | 93%-94% | 64%-90% | — | Güngör and Ünlü (2005) |
| LS (Loamy Sand) | Loamy sand (Fixed-bed column study) | — | — | — | 95% | 93% | — | Güngör and Ünlü (2005) |
| SL (Sandy Loam) | Sandy loam (Fixed-bed column study) | — | — | — | 83%-96% | 45%-73% | — | Güngör and Ünlü (2005) |
| Minnesota Filter | 5.0% iron filings (weight) 95.0% sand (weight) (Fixed-bed column study) | — | 88.5% | — | — | — | — | Erickson et al. (2012) |
| | 10.7% iron filings (weight) 89.3% sand (weight) (Stormwater wet pond) | — | 60-90% | — | — | — | — | Erickson et al. (2012) |
| Iron and Aluminum Hydroxide coated Filter Media | Sand Olivine Aluminum chloride and ferric chloride (Fixed-bed column study) | — | 70%-90% | — | — | — | — | Ayoub et al. (2001) |

To understand the dynamic behavior of the media, experimental data obtained from the nitrate sorption curves were inserted into the B-A, MDR, Thomas, Clark, Yoon-Nelson, Wang, and Wolborska models for comparison. These dynamic sorption models were not applied for phosphate sorption, given that over 90% of phosphate was removed during the time of the experiment, and no breakthrough curve was observed. The high capacity of both IFGEM and AGEM-2 for phosphate removal indicates that nitrate is the limiting nutrient for removal.

Based on the correlation factor ($R^2$) obtained after applying the experimental data to the dynamic sorption models, the models were categorized from the most appropriate to the least appropriate for both IFGEM and AGEM-2 mixes. For the IFGEM mix, the MDR model had the highest $R^2$ value (0.602), followed by the Wolborska (0.322), Yoon-Nelson (0.296), and Clark (0.24). Thomas, B-A, and Wang models were the three least suitable models, with $R^2$ values of 0.228. Similarly to IFGEM, the MDR model was the most appropriate for the AGEM-2 mix, with the highest $R^2$ value (0.854), followed by the Yoon-Nelson (0.634), Wang (0.634), B-A (0.633), Clark (0.571), Wolborska (0.571), and Thomas (0.528) models. The equation derived from the MDR model for the IFGEM mix is y=0.132x−1.2622 and for the AGEM-2 mix is y=0.2344x−2.8372. Such equations were utilized to predict the sorption capacity ($q_o$) of the media mixes, with the AGEM-2 mix presenting a higher sorption capacity value in comparison to the IFGEM mix.

Figure 12:
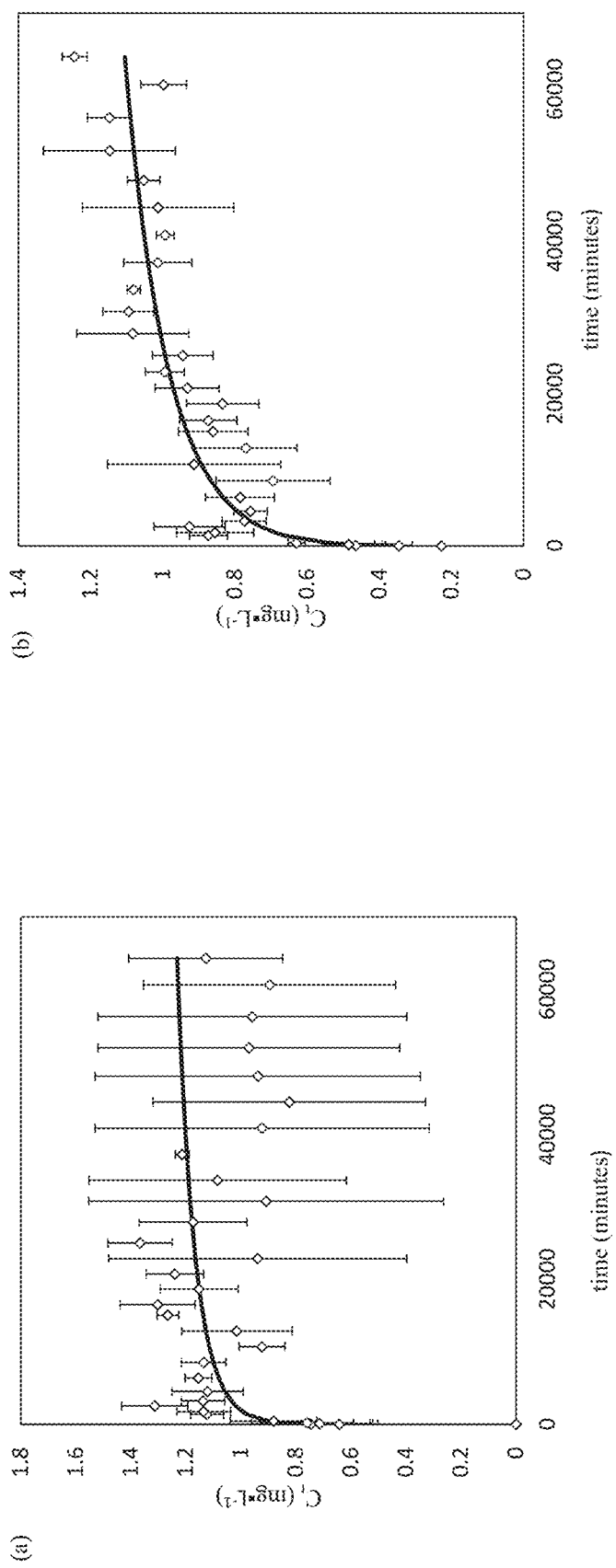
FIG. 12 is a graphical depiction of experimental values and modeled results from nitrate sorption curves for an iron-filing-based filter medium (in section A) and for an aluminum-based filter medium (in section B).

The predicted $q_o$ values for the AGEM-2 and IFGEM mixes are 0.36 mg·g$^{-1}$ and 0.028 mg·g$^{-1}$, respectively. Furthermore, the lower sorption capacity of IFGEM is an additional result of the high standard deviation within the triplicate columns that resulted in a lower correlation factor in comparison to AGEM-2. The derived equations can be utilized to estimate the dynamic behavior of each media mix and applied for future engineering design implementation. The comparison of the feasibility predicted by the MDR model and the actual (experimental) nitrate sorption values is presented in FIG. 12.

Since determining the nutrient adsorption and recovery potential of the media is based on a cumulative basis according to the total experiment run time, a method for estimation was employed. The quantity of nutrients adsorbed by each sorption media over a period of approximately 45 days (64,275 minutes) was estimated by subtracting the total effluent nutrient loading (phosphate and nitrate) from the total nutrient loading supplied by the influent. The nutrient loading supplied was calculated by multiplying the influent flowrate (Q), the influent concentration, the feeding time (t), and a conversion factor (C.F) to convert L to mL (Equation 26)

$$\text{Total nutrient loading fed} = \text{Influent concentration}\left(\frac{mg}{L}\right) * Q\left(\frac{mL}{min}\right) * t(\min) * C.F.\left(\frac{L}{1000mL}\right) \quad (26)$$

The total effluent nutrient loading for nitrate and phosphate were determined by calculating the area under a concave or convex regression curve obtained from the time vs. effluent nutrient loading plot, respectively (Equations 27 and 28).

$$\int_{t_0}^{t_f} (-ae^{-bx} + c)dx \quad (27)$$

$$\int_{t_0}^{t_f} (ae^{-bx} + c)dx \quad (28)$$

where a, b>0 and c>0.

The total nutrient loading delivered to each column was 161.42 mg of $NO_3^-$ and 377.56 mg of $PO_4^{3-}$. The quantity of nutrients adsorbed by the IFGEM mix, as determined from the regression curves, was approximately 161.42 mg of $NO_3^-$ and 377.56 mg of $PO_4^{3-}$. For the AGEM-2 mix, the quantity of nutrient adsorbed was approximately 200.61 mg of $NO_3^-$ and 371.20 mg of $PO_4^{3-}$. Based on such results, the maximum sorption capacities of IFGEM and AGEM-2 for nitrate and phosphate were determined by dividing the calculated nutrient removed divided by the total mass of the media in the columns using the mass of media as 500 g. The maximum nitrate adsorption values for IFGEM and AGEM-2 were 0.32 mg·g$^{-1}$ and 0.40 mg·g$^{-1}$ of media, respectively, whereas the maximum phosphate adsorption values for IFGEM and AGEM-2 were 0.76 mg·g-1 and 0.74 mg·g$^{-1}$, respectively.

AGEM-2 was found to adsorb more nitrate than IFGEM, while IFGEM adsorbed slightly more phosphate than AGEM-2. Furthermore, the AGEM-2 mix adsorbed 52% of the total nitrate fed, while the IFGEM mix adsorbed 42%. Both media mixes exhibited elevated phosphate adsorption within the sorption process, with 98% and 96% of the total phosphate load adsorbed by the IFGEM mix and the AGEM-2 mix, respectively. The comparable phosphate removal of both media occurred, because sorption of phosphate did not cease during the experiment.

Figure 13:
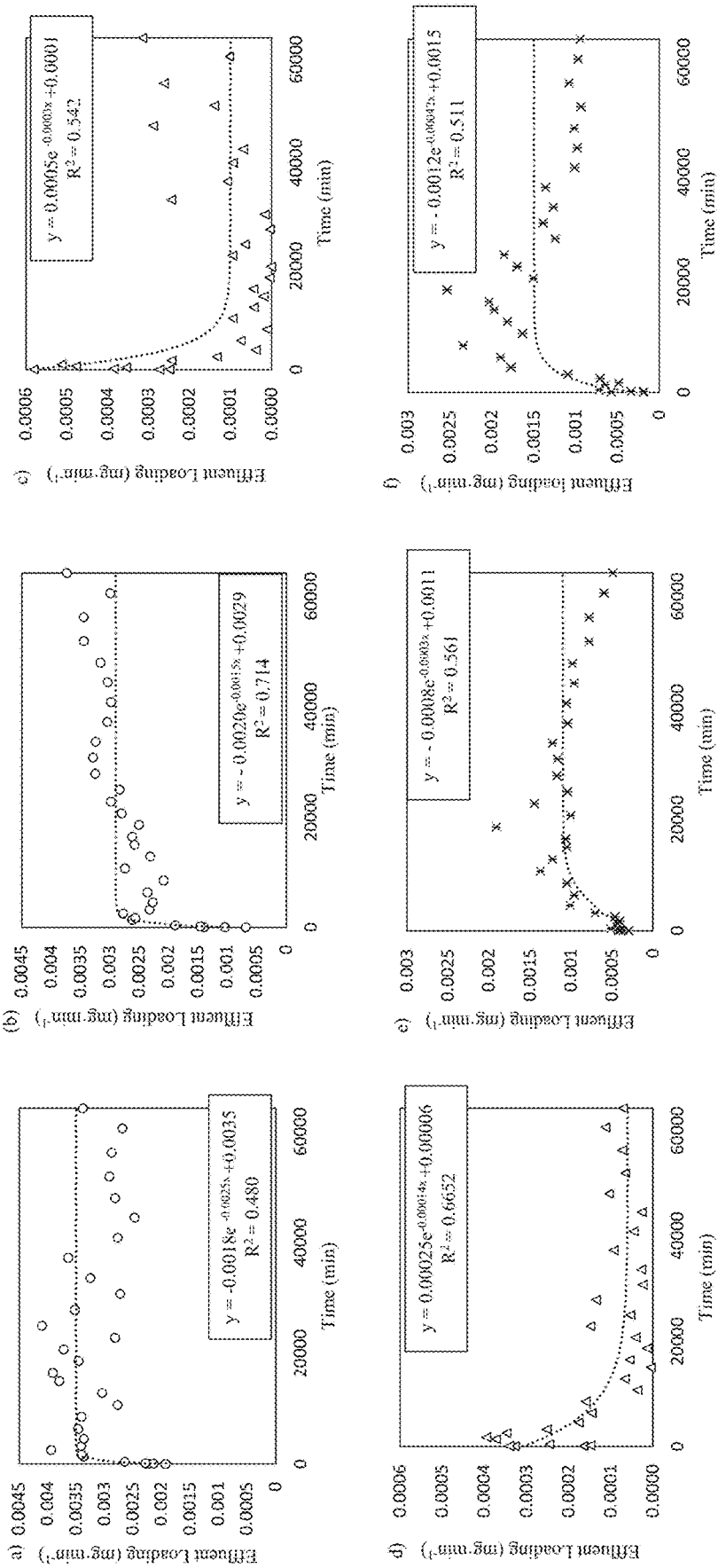
FIG. 13 graphically depicts effluent nutrient loading versus time plots, trendlines, and trendline equations for nitrate, phosphate, and ammonia sorption processes for an iron-filing-based filter medium (in sections A, C, and E, respectively); and for nitrate, phosphate, and ammonia sorption processes for an aluminum-based filter medium (in sections B, D, and F, respectively).

Further, the quantity of the ammonia resultant as a byproduct of the reaction of the IFGEM mix was 68.03 mg of $NH_3$, while the average nutrient load from the effluent of the AGEM-2 mix was 93.40 mg of $NH_3$. The superior amount of ammonia detected in the effluent from the AGEM-2 mix supports the suggestion that better nitrate reduction occurred in comparison to the IFGEM mix, in which nitrate was converted into ammonia, also suggesting a higher potential for phosphate and ammonia recovery. Aluminum in the nitrate reduction resulted in a higher generation of ammonia, which reacted with phosphate, resulting in the phosphate salts precipitates that were intercepted in the media. FIG. 13 shows the effluent nutrient loading versus the time plot, regression curve, and regression curve equation for nitrate, phosphate, and ammonia sorption processes for the IFGEM and AGEM-2 mixes. Such nutrients can further be desorbed, or the media mix can be directly applied in soils as soil amendments, suggesting higher potential for nutrient recovery.

Figure 14:
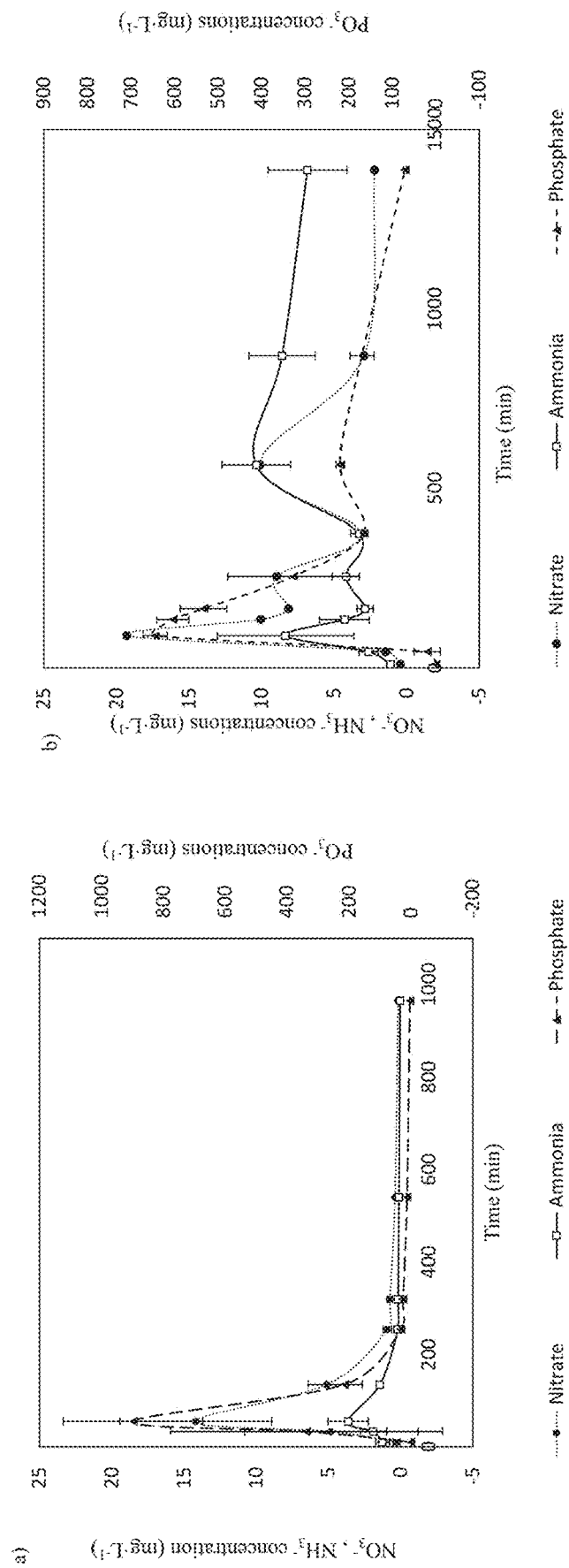
FIG. 14 is a comparative graph depicting desorption processes for desorption curves with NaOH for an iron-filing-based filter medium (in section A) and for an aluminum-based filter medium (in section B).

The potential for in-situ regeneration of the media mix can be achieved via a desorption process that can likewise allow the retrieval of nutrients, making them available for different applications like fertilizer substitution or supplemental additive. A proper design can optimize cost and improve environmental sustainability, as it eliminates the cost associated with the replacement of the media, minimizes the environmental hazard by eliminating landfill disposal of saturated media, and reduces the need for P and N mining. A desorption process performed with the application of 1% NaOH (Kawasaki et al. 2010, Saad et al. 2007) on IFGEM and AGEM-2 indicated that IFGEM has a higher potential for in-situ regeneration and nutrient recovery than AGEM-2, as the observed desorption curve for IFGEM (section A of FIG. 14) had a smooth bell shape, and within 255 minutes the majority of the nutrients were desorbed from the media.

Figure 15:
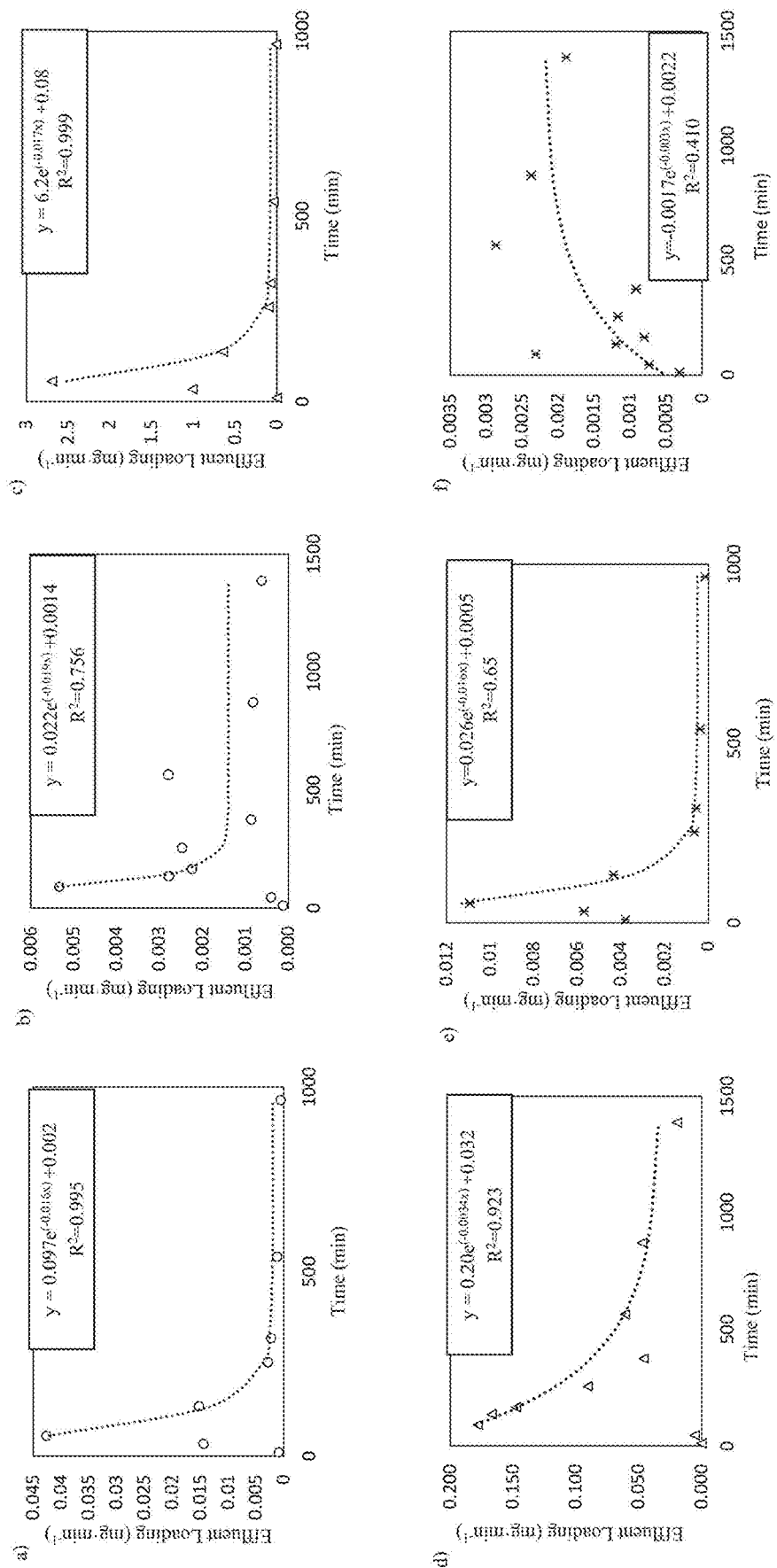
FIG. 15 graphically depicts effluent nutrient loading versus time plots, trendlines, and trendline equations for nitrate, phosphate, and ammonia desorption processes for an iron-filing-based filter medium (in sections A, C, and E, respectively); and for nitrate, phosphate, and ammonia desorption processes for an aluminum-based filter medium (in sections B, D, and F, respectively).

A similar method to the adsorption process was applied to approximate the total effluent nutrient loading for nitrate, phosphate, and ammonia. The quantity of nutrient desorbed was determined by calculating the area under a concave or convex regression curve obtained from the time vs. effluent nutrient loading plot. The area under the concave or convex regression curves was used to estimate the amount of chemicals being adsorbed or desorbed. The curve regression derived for IFGEM media to approximate the nutrient desorption was fitted to 6 data points, corresponding to samples collected at 55 min to 965 min (sections A, C, and E of FIG. 15). Similarly, for AGEM-2 media, the regression curves were fitted to 5 data points, corresponding to sample collection times of 90 min to 1387 mins (section b and d of FIG. 15). In order to obtain the regression curve for AGEM-2 ammonia desorption, all data points (10 min to 1387 min) were utilized, since the effluent ammonia loading exhibited an increase at 375 mins, resulting in a peak towards the end, unlike nitrate and phosphate desorption. By excluding the initial data points of effluent sample collection for the majority of the desorption data, it is possible to attain a better approximation when employing the area under the regression curve method. In general, the $R^2$ values are considered as approximately $R^2 > 0.65$, with the exception of ammonia for AGEM-2, which attained an $R^2 = 0.41$.

During the desorption process, the effluent solution was collected for 965 minutes, and the collected solution was measured for phosphate and ammonia concentrations. The collected IFGEM effluent concentration for phosphate was $62 \pm 1.34$ mg·L$^{-1}$, resulting in approximately 48% of phosphate recovery (179.5 mg of $PO_4^{3-}$. This was compared with the calculated effluent phosphate recovery of 215.98 mg from the regression curve. The ammonia concentration of the effluent was $0.59 \pm 0.06$ mg·L$^{-1}$, indicating that about 1.7 mg of $NH_4^+$ was recovered per column. Further, this value is in proximity to the ammonia concentration of 1.13 mg obtained for the area under the regression curve. Since the effluent nitrate concentration was the only parameter not measured, a quantity of 4.33 mg of $NO_3^-$ was calculated from the area under the regression curve. However, this solution requires prior treatments before application, given its basic pH of 12 and high NaOH concentration. The solution can further be subjected to a precipitation process or combustion process to retrieve the recovered phosphate and ammonia in the liquid phase as solids.

AGEM-2 exhibited slightly higher nutrient desorption, however, the desorption curves were very unstable. The hydraulic conductivity of AGEM-2 was impacted by the addition of NaOH at the given concentration (1% NaOH), and approximately 23 hours were required to desorb the nutrients from the media. Moreover, during this time the feeding pump was paused for prolonged time intervals to prevent overflowing due to the minimal influent infiltration through the media (section B of FIG. 14). The change in hydraulic conductivity may be the result of the interaction of NaOH and aluminum, which resulted in the production of the precipitate $NaAlO_2$ and hydrogen gas. This delayed the infiltration of the influent, causing the uneven shape of the desorption curve (section B of FIG. 14). The presence of Na prevented the determination of the effluent nutrient concentrations from the collected water samples due to interference. This outcome suggests that utilizing a lower concentration of NaOH may prevent the precipitation of $NaAlO_2$ and hydrogen gas, thereby reducing their effect on the infiltration rate (Loganathan et al. 2014) and making the regeneration of the AGEM-2 media possible. As a result, the areas under the desorption regression curves were used to approximate the quantity of nutrients in the effluent. An effluent nutrient quantity of 5.77 mg $NO_3^-$, 226.87 mg of $PO_4^{3-}$, and 7.26 mg of $NH_4^+$ were calculated for AGEM-2 mix.

Once the desorption process concluded, it was observed that the IFGEM mix had a more loose and uniform texture that retained moisture, whereas the AGEM-2 mix exhibited a compact and brittle texture, with observable white precipitates within the media. The change in the texture of AGEM-2 could be a result of the interception of precipitate $NaAlO_2$ and possible $NaPO_4^-$ formation by the media, which can also explain the lower peak in the phosphate desorption curve for AGEM-2.

Table 9 depicts the performance of IFGEM and AGEM-2 with respect to nutrient removal and recovery potential. As ammonia was not supplied in the influent, the method for determining the quantity of ammonia generated by the media differs from that of nitrate and phosphate. From the effluent loading curve, the calculated area under the regression curve signifies the amount of ammonia released during the adsorption process (sections E and F of FIG. 13). This release of ammonia is associated with the distinct chemical reactions causing ammonia production in the liquid phase. The quantity of ammonia detected in the effluent during the desorption (FIG. 15) process represents the partial quantity of ammonia retained by the media during the sorption process. However, this value should only be used as an initial quantification, given all the possible reactions proceeded from ammonia interactions. It may also be possible that not all ammonia was desorbed during the desorption process, which would impact the quantity of ammonia measured in the effluent of the desorption process. The results suggest that both IFGEM and AGEM-2 are comparable in $NO_3^-$ and $PO_4^{3-}$ sorption, and mainly differ in their ammonia recovery potential in a food-water nexus applicable for some urban farming sites.

TABLE 9

Performance of nutrient removal and recovery potential of IFGEM and AGEM-2

| Nutrient | Total Nutrient Loading (mg)[a] | Nutrient Absorbed (mg) | Maximum Sorption Capacity (mg/g) | Nutrient Produced and Released to Effluent During Absorption (mg)[b] | Nutrient Released to Effluent During Desorption (mg)[c] | Nutrient Generated (recovered) (mg)[d] |
|---|---|---|---|---|---|---|
| IFGEM | | | | | | |
| $NO_3^-$ | 385.65 | 161.42 | 0.32 | — | 4.33 | — |
| $PO_4^{3-}$ | 385.64 | 377.56 | 0.76 | — | 215.98 | — |
| $NH_3^+$ | 0 | — | — | 68.03 | 1.13 | 69.16 |

TABLE 9-continued

Performance of nutrient removal and recovery potential of IFGEM and AGEM-2

| Nutrient | Total Nutrient Loading (mg)[a] | Nutrient Absorbed (mg) | Maximum Sorption Capacity (mg/g) | Nutrient Produced and Released to Effluent During Absorption (mg)[b] | Nutrient Released to Effluent During Desorption (mg)[c] | Nutrient Generated (recovered) (mg)[d] |
|---|---|---|---|---|---|---|
| AGEM-2 | | | | | | |
| $NO_3^-$ | 385.65 | 200.61 | 0.40 | — | 2.03 | — |
| $PO_4^{3-}$ | 385.64 | 371.20 | 0.74 | — | 84.29 | — |
| $NH_3^+$ | 0 | — | — | 93.4 | 2.49 | 95.89 |

Figure 16:
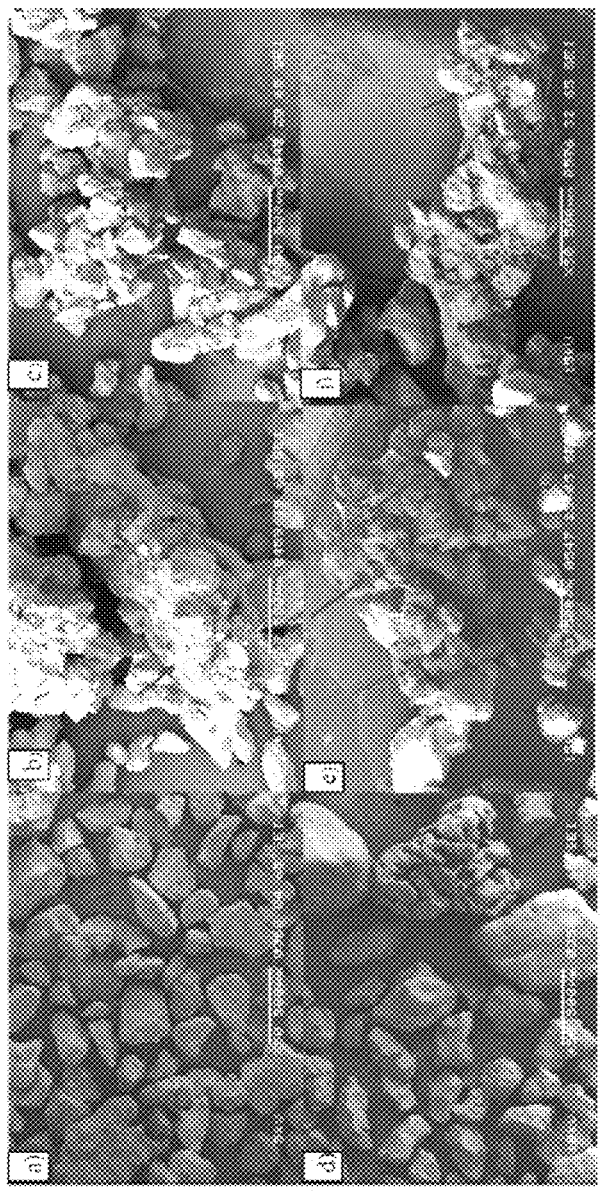
FIG. 16 depicts scanning electron microscopy images for an iron-filing-based filter medium pre-study, after the sorption process, and after the desorption process (in sections A, B, and C, respectively); and for an aluminum-based filter medium pre-study, after the sorption process, and after the desorption process (in sections D, E, and F, respectively).

[a] cumulative quantity of nutrient supplied over experiment run (64,275 min)
[b] nutrient produced and released in the effluent by the media during the sorption stage, calculated from regression curve
[c] nutrient released in the effluent by the media during the desorption stage, calculated from regression curve
[d] sum of ammonia released during sorption stage and amount recovered from the media during the desorption stage The physical changes in the media produced by the sorption and desorption processes were further visualized by Scanning Electron Microscopy (SEM) images, which were captured from the top section of each IFGEM and AGEM-2 (FIG. 16) column. Initially, before undergoing any process, the IFGEM and AGEM-2 particles were unattached and had a smooth appearance. Once the sorption process ended, the IFGEM and AGEM-2 particles appeared to be attached together into larger particles by a thick layer resembling an adhesive. After the desorption process, this layer was visibly reduced in both media, and the layer acting as an adhesive was more porous than in the adsorption process, supporting the observation of the deterioration of the coating layer, as indicated by the red arrows. However, when comparing the overall change of the media during the distinct processes, the change observed by the SEM images was not as notable as expected for a desorption process. This suggests that after the desorption process, the media was not completely regenerated to its original state with the presence of a remaining layer of coating on the media particles. This indicated that the desorption process was not complete, therefore the quantity of ammonia and phosphate measured in the desorption process may not be precise, as nutrients may have still been attached to the media particles.

Conclusion

A fixed-bed column study was performed using IFGEM and AGEM-2 to explore their removal and release potentials after being exposed continuously to spiked distilled water (nitrate and phosphate), simulating stormwater with a high nutrient concentration. The removal process is a combination of absorption, adsorption, reduction-oxidation, ion exchange, and precipitation. The nutrient removals of IFGEM and AGEM-2 in this fixed-bed column study indicated that they are comparable, although a slightly better performance and less variability (more reliability) between triplicates was observed in AGEM-2. Additionally, the phosphate and nitrate removal processes of IFGEM and AGEM-2 can be interpreted as complementary chemical processes. Optimum phosphate removal was achieved by utilizing ammonia, a byproduct of nitrate reduction that precipitated to form ammonium-phosphate salt. Furthermore, the formed precipitate was intercepted by the media that accumulated in the void space, thus permitting and supporting the prolonged phosphate removal. The production of ammonia suggests that AGEM-2 has a better capability to treat nutrient laden stormwater and wastewater given that the inclusion of aluminum powder in the mix exhibited a superior nitrate reduction that resulted in more ammonia production that can be utilized in the system for phosphate treatability and increased the potential for ammonia and phosphate recovery. Overall, the AGEM-2 mix exhibits the synergy among clay, iron, and aluminum particles with higher reliability in a food-water nexus for real-world applications.

REFERENCES

Antipina, S. A., Zmanovskii, S. V., Gromov, A. A., Konovalov, A. S., 2017. Oxidation of fine aluminum powders with water and air. Russian Journal of Physical Chemistry A 91, 52-58.

Araneda, C., Basualto, C., Sapag, J., Tapia, C., Cotorás, D. and Valenzuela, F. (2011) Uptake of copper (II) ions from acidic aqueous solutions using a continuous column packed with microcapsules containing a β-hydroxyoximic compound. Chemical Engineering Research and Design 89(12), 2761-2769.

Ayoub, G. M., Koopman, B. and Pandya, N. (2001) Iron and aluminum hydroxy (oxide) coated filter media for low-concentration phosphorus removal. Water Environment Research 73(4), 478.

Azizian, S., S. Eris, and L. D. Wilson, Re-evaluation of the century-old Langmuir isotherm for modeling adsorption phenomena in solution. Chemical Physics, 2018. 513: p. 99-104.

Badruzzaman, M., Pinzon, J., Oppenheimer, J. and Jacangelo, J. (2012) Sources of nutrients impacting surface waters in Florida: A review. Journal of Environmental Management 109, 80-92.

Blackwell, M., Darch, T. and Haslam, R. (2019) Phosphorus Use Efficiency and Fertilizers: future opportunities for improvements. Frontiers of Agricultural Science and Engineering 6(4), 332-340.

Brattebø, H. and Odegaard, H. (1986) Phosphorus removal by granular activated alumina. Water research 20(8), 977-986.

Can, N., B. C. Ömür, and A. Altindal, Modeling of heavy metal ion adsorption isotherms onto metallophthalocyanine film. Sensors and Actuators B: Chemical, 2016. 237: p. 953-961.

Caraco, N. F. (1993) Disturbance of the phosphorus cycle: a case of indirect effects of human activity. Trends in Ecology & Evolution 8(2), 51-54.

Carrington, D. (2019 Sep. 9) Phosphate fertiliser 'crisis' threatens world food supply. The Guardian. Retrieved from https://www.theguardian.com.

Chang, N.-B., Houmann, C. and Wanielista, M. (2016b) Scaling up adsorption media reactors for copper removal with the aid of dimensionless numbers. Chemosphere 144, 1098-1105.

Chang, N.-B., Houmann, C., Lin, K.-S. and Wanielista, M. (2016a) Fate and transport with material response characterization of green sorption media for copper removal via adsorption process. Chemosphere 144, 1280-1289.

Chang, N.-B., Wanielista, M., Singh, A., Duranceau, S. J. and Wang, D. (2018a) Bio-sorption Activated Media for Nitrogen Removal In a Rapid Infiltration Basing Monitoring Project, FDEP.

Chang, N. B., Wen, D. and Wanielista, M. P. (2018b) Impact of changing environmental factors and species competition on iron filings-based green environmental media for nutrient removal in stormwater treatment. Environmental Progress & Sustainable Energy, 1-14.

Chang, N.-B., Xuan, Z. and Wanielista, M. P. (2012) A tracer study for assessing the interactions between hydraulic retention time and transport processes in a wetland system for nutrient removal. Bioprocess and Biosystems Engineering 35(3), 399-406.

Cheknane, B., Baudu, M., Basly, J.-P., Bouras, O. and Zermane, F. (2012) Modeling of basic green 4 dynamic sorption onto granular organo-inorgano pillared clays (GOICs) in column reactor. Chemical Engineering Journal 209, 7-12.

Cheng, I. F., et al., Reduction of nitrate to ammonia by zero-valent iron. Chemosphere, 1997. 35(11): p. 2689-2695.

Choe, S., H. M. Liljestrand, and J. Khim, Nitrate reduction by zero-valent iron under different pH regimes. Applied Geochemistry, 2004. 19: p. 335-342.

Cormier, J. A. and Duranceau, S. J. (2019) Comparison of a modified and traditional rapid infiltration basin for treatment of nutrients in wastewater effluent. Water Environment Research 1-14.

Crhribi, A. and Chlendi, M. (2011) Modeling of fixed bed adsorption: application to the adsorption of an organic dye. Asian J. Textile 1, 161-171.

Dada, A., et al., Langmuir, Freundlich, Temkin and Dubinin-Radushkevich isotherms studies of equilibrium sorption of Zn2+ unto phosphoric acid modified rice husk. IOSR Journal of Applied Chemistry, 2012. 3(1): p. 38-45.

Desta, M. B., Batch sorption experiments: Langmuir and Freundlich isotherm studies for the adsorption of textile metal ions onto teff straw (Eragrostis tef) agricultural waste. Journal of thermodynamics, 2013. 2013.

Donnert, D., 1999. Elimination of Phosphorus from Municipal and Industrial Waste Water. Water Science & Technology 40, 195-202.

Du, X., Wang, Y., Su, X., Li, J., 2009. Influences of pH value on the microstructure and phase transformation of aluminum hydroxide. Power Technology, 192, 40-46.

Dubey, S., D. Gusain, and Y. C. Sharma, Kinetic and isotherm parameter determination for the removal of chromium from aqueous solutions by nanoalumina, a nanoadsorbent. Journal of Molecular Liquids, 2016. 219: p. 1-8.

Ebrahim, S. E. and Mustafa, Y. A. (2010) Utilization of Thomas model to predict the breakthrough curves for adsorption and ion exchange. Journal of Engineering 16(4), 6206-6223.

Erickson, A. J., Gulliver, J. S. and Weiss, P. T. (2012) Capturing phosphates with iron enhanced sand filtration. Water Research 46(9), 3032-3042.

Fitter, A. and C. Sutton, The use of the Freundlich isotherm for soil phosphate sorption data. Journal of Soil Science, 1975. 26(3): p. 241-246.

Franzoni, F., Milani, M., Montorsi, L., Golovitchev, V., 2010. Combined hydrogen production and power generation from aluminum combustion with water: Analysis of the concept. International Journal of Hydrogen Energy 35, 1548-1559.

Fredrickson, J. K., et al., Biogenic iron mineralization accompanying the dissimilatory reduction of hydrous ferric oxide by a groundwater bacterium. Geochimica et Cosmochimica Acta, 1998. 62(19-20): p. 3239-3257.

Genz, A., Kornmüller, A., Jekel, M., 2004. Advanced phosphorus removal from membrane filtrates by adsorption on activated aluminum oxide and granulated ferric hydroxide. Water Research 38, 3523-3530.

Gromov, A., Vereshchagin, V., 2004. Study of aluminum nitride formation by superfine aluminum powder combustion in air. Journal of European Ceramic Society 24, 2879-2884.

Güngör, K. and Ünlü, K. J. T. J.o.E. (2005) Nitrite and nitrate removal efficiencies of soil aquifer treatment columns. Turkish Journal of Engineering Environmental Sciences 29(3), 159-170.

Guo, L., Zhang, S.-F., Ju, B.-Z. and Yang, J.-Z. (2006) Study on adsorption of Cu (II) by water-insoluble starch phosphate carbamate. Carbohydrate Polymers 63(4), 487-492.

Gusain, D., et al., Kinetics and isotherm study on adsorption of chromium on nano crystalline iron oxide/hydroxide: linear and nonlinear analysis of isotherm and kinetic parameters. Research on Chemical Intermediates, 2016. 42(9): p. 7133-7151.

Hachiya, T., Sakakibara, H., 2016. Interactions between nitrate and ammonium in their uptake, allocation, assimilation, and signaling in plants. Journal of Experimental Botany 68, 2501-2512.

Hamdaoui, O. (2006) Dynamic sorption of methylene blue by cedar sawdust and crushed brick in fixed bed columns. Journal of Hazardous Materials 138(2), 293-303.

Hamdaoui, O. and E. Naffrechoux, Modeling of adsorption isotherms of phenol and chlorophenols onto granular activated carbon: Part I. Two-parameter models and equations allowing determination of thermodynamic parameters. Journal of hazardous materials, 2007. 147(1-2): p. 381-394.

Hanen, N. and Abdelmottaleb, O. (2013) Modeling of the dynamics adsorption of phenol from an aqueous solution on activated carbon produced from olive stones. Journal of Chemical Engineering & Process Technology 4(3).

Hano, T., Takanashi, H., Hirata, M., Urano, K. and Eto, S. (1997) Removal of phosphorus from wastewater by activated alumina adsorbent. Water Science and Technology 35(7), 39.

Heraldy, E., Y. Hidayat, and M. Firdaus. The langmuir isotherm adsorption equation: the monolayer approach. in IOP Conference Series: Materials Science and Engineering. 2016. IOP Publishing.

Hood, A., Chopra, M. and Wanielista, M. (2013) Assessment of Biosorption Activated Media Under Roadside Swales for the Removal of Phosphorus from Stormwater. Water 5(1), 53-66.

Hossain, F., Chang, N.-B. and Wanielista, M. (2010) Modeling kinetics and isotherms of functionalized filter media for nutrient removal from stormwaterd dry ponds. Environmental Progress & Sustainable Energy 29(3), 319-333.

Huang, C. (1977) Removal of phosphate by powdered aluminum oxide adsorption. Journal of Water Pollution Control Federation 1811-1817.

Huang, J., Xu, C.-c., Ridoutt, B. G., Wang, X.-c. and Ren, P.-a. (2017) Nitrogen and phosphorus losses and eutrophication potential associated with fertilizer application to cropland in China. Journal of Cleaner Production 159, 171-179.

Ibrahim, A., et al., Mathematical Model Describes Treatment of Waste Water Using Modified Activated Carbon. The Journal of Engineering Research [TJER], 2017. 14(1): p. 94-104.

Inyang, H. I., A. Onwawoma, and S. Bae, The Elovich equation as a predictor of lead and cadmium sorption rates on contaminant barrier minerals. Soil and Tillage Research, 2016. 155: p. 124-132.

Jiao, W., Chen, W., Chang, A. C., Page, A. L., 2012. Environmental risks of trace elements associated with long-term phosphate fertilizers applications: a review. Environmental Pollution 168, 44-53.

Johnson, R. D. and F. H. Arnold, The Temkin isotherm describes heterogeneous protein adsorption. Biochimica et Biophysica Acta (BBA)-Protein Structure and Molecular Enzymology, 1995. 1247(2): p. 293-297.

Jovanovic, D., Physical adsorption of gases. I. Isotherms for monolayer and multilayer adsorption. Kolloid-Zeitschrift and Zeitschrift Fur Polymere, 1969. 235(1): p. 1203-+.

Kawasaki, N., Ogata, F. and Tominaga, H. (2010) Selective adsorption behavior of phosphate onto aluminum hydroxide gel. Journal of Hazardous Materials 181(1-3), 574-579.

Kundu, S. and A. Gupta, Arsenic adsorption onto iron oxide-coated cement (IOCC): Regression analysis of equilibrium data with several isotherm models and their optimization. Chemical Engineering Journal, 2006. 1(122): p. 93-106.

Kuo, S., Jellum, E. and Pan, W. (1988) Influence of phosphate sorption parameters of soils on the desorption of phosphate by various extractants. Soil Science Society of America Journal 52(4), 974-979.

Landsman, M. R. and A. P. Davis, Evaluation of Nutrients and Suspended Solids Removal by Stormwater Control Measures Using High-Flow Media. Journal of Environmental Engineering, 2018. 144(10): p. 04018106.

Le Cone, K. S., Valsami-Jones, E., Hobbs, P., Parsons, S. A., 2009. Phosphorus Recovery from Wastewater by Struvite Crystallization: A Review. Critical Reviews in Environmental Science and Technology 39, 433-477.

Le, C., Zha, Y., Li, Y., Sun, D., Lu, H. and Yin, B. (2010) Eutrophication of lake waters in China: cost, causes, and control. Environmental Management 45(4), 662-668.

Lee, C. g., T. D. Fletcher, and G. Sun, Nitrogen removal in constructed wetland systems. Engineering in Life Sciences, 2009. 9(1): p. 11-22.

Loganathan, P., Vigneswaran, S., Kandasamy, J. and Bolan, N. S. (2014) Removal and recovery of phosphate from water using sorption. Critical Reviews in Environmental Science and Technology 44(8), 847-907.

Lu, S., Zhang, X., Wang, J. and Pei, L. (2016) Impacts of different media on constructed wetlands for rural household sewage treatment. Journal of Cleaner Production 127, 325-330.

Luk, G. and W. Au-Yeung, Experimental investigation on the chemical reduction of nitrate from groundwater. Advances in environmental research, 2002. 6(4): p. 441-453.

Mamo, M., Taylor, R. W. and Shuford, J. W. (1993) Ammonium fixation by soil and pure clay minerals. Communications in soil science and plant analysis 24(11-12), 1115-1126.

Martin, R. B., The chemistry of aluminum as related to biology and medicine. Clinical Chemistry, 1986. 32(10): p. 1797-1806.

McGowen, S., Basta, N., Brown, G., 2001. Use of diammonium phosphate to reduce heavy metal solubility and transport in smelter-contaminated soil. Journal of Environmental Quality 30, 493-500.

Mikkelsen, P., Häfliger, M., Ochs, M., Jacobsen, P., Tjell, J. and Boller, M. (1997) Pollution of soil and groundwater from infiltration of highly contaminated stormwater—a case study. Water Science and Technology 36(8-9), 325-330.

Murphy A. P, Chemical removal of nitrate from water Nature, 1991. 350: p. 223-225.

Nodeh, H. R., et al., Enhanced removal of phosphate and nitrate ions from aqueous media using nanosized lanthanum hydrous doped on magnetic graphene nanocomposite. Journal of environmental management, 2017. 197: p. 265-274.

Ostrom, T. K. and Davis, A. P. (2019) Evaluation of an enhanced treatment media and permeable pavement base to remove stormwater nitrogen, phosphorus, and metals under simulated rainfall. Water Research 166, 115071.

Plett, D. C., Holtham, L. R., Okamoto, M., Garnett, T. P., 2018. Nitrate uptake and its regulation in relation to improving nitrogen use efficiency in cereals. Seminars in Cell & Developmental Biology 74, 97-104.

Quiñones, I. and G. Guiochon, Extension of a Jovanovic-Freundlich isotherm model to multicomponent adsorption on heterogeneous surfaces. Journal of Chromatography A, 1998. 796(1): p. 15-40.

Ramaekers, L., Remans, R., Rao, I. M., Blair, M. W., Vanderleyden, J., 2010. Strategies for improving phosphorus acquisition efficiency of crop plants. Field Crops Research 117, 169-176.

Razavi-Tousi, S. S., Szpunar, J. A., 2013. Effect of structural evolution of aluminum powder during ball milling on hydrogen generation in aluminum-water reaction. International Journal of Hydrogen Energy 38, 795-806.

Reddy, K., Overcash, M., Khaleel, R. and Westerman, P. (1980) Phosphorus Adsorption-Desorption Characteristics of Two Soils Utilized for Disposal of Animal Wastes 1. Journal of Environmental Quality 9(1), 86-92.

Reed, B. E. and M. R. Matsumoto, Modeling cadmium adsorption by activated carbon using the Langmuir and Freundlich isotherm expressions. Separation science and technology, 1993. 28(13-14): p. 2179-2195.

Rosenband, V., Gany, A., 2010. Application of activated aluminum powder for generation of hydrogen from water. International Journal of Hydrogen Energy 35, 10898-10904.

Rout, P. R., Dash, R. R. and Bhunia, P. (2016) Nutrient removal from binary aqueous phase by dolochar: Highlighting optimization, single and binary adsorption isotherms and nutrient release. Process Safety and Environmental Protection 100, 91-107.

Saad, R., Belkacemi, K. and Hamoudi, S. (2007) Adsorption of phosphate and nitrate anions on ammonium-functionalized MCM-48: Effects of experimental conditions. Journal of colloid and Interface Science 311(2), 375-381.

Scarlett, R. D., McMillan, S. K., Bell, C. D., Clinton, S. M., Jefferson, A. J., Rao, P. S. C., 2018. Influence of stormwater control measures on water quality at nested sites in a small suburban watershed. Urban Water Journal 15, 868-879.

Sharma, S. B., Sayyed, R. Z., Trivedi, M. H., Gobi, T. A., 2013. Phosphate solubilizing microbes: sustainable approach for managing phosphorus deficiency in agricultural soils. SpringerPlus 2, 2-14.

Shrestha, S., et al., Isotherm and thermodynamic studies of Zn (II) adsorption on lignite and coconut shell-based activated carbon fiber. Chemosphere, 2013. 92(8): p. 1053-1061.

Sun, W., Liu, Y., Li, T., Cui, S., Chen, S., Yu, Q., Wang, D., 2019. Anti-corrosion of amphoteric metal enhanced by MAO/corrosion inhibitor composite in acid, alkaline and salt solutions. Journal of Colloid and Interface Science 554, 488-499.

Thawornchaisit, U., Polprasert, C., 2009. Evaluation of phosphate fertilizers for the stabilization of cadmium in highly contaminated soils. Journal of Hazardous Materials 165, 1109-1113.

Townsend, A. R., Howarth, R. W., Bazzaz, F. A., Booth, M. S., Cleveland, C. C., Collinge, S. K., Dobson, A. P., Epstein, P. R., Holland, E. A. and Keeney, D. R. (2003) Human health effects of a changing global nitrogen cycle. Frontiers in Ecology and the Environment 1(5), 240-246.

Trgo, M., Medvidović, N. V. and Perić, J. (2011) Application of mathematical empirical models to dynamic removal of lead on natural zeolite clinoptilolite in a fixed bed column. Indian journal of Technology 18(2), 123-131

Urbonas, B. and Stahre, P. (1993) Stormwater: best management practices and detention for water quality, drainage, and CSO management. PTR Prentice Hall, 471.

Uribarri, J. and Calvo, M. S. (2013) Dietary phosphorus excess: a risk factor in chronic bone, kidney, and cardiovascular disease?. Advances in Nutrition 4(5), 542-544.

Vadivelan, V. and K. V. Kumar, Equilibrium, kinetics, mechanism, and process design for the sorption of methylene blue onto rice husk. Journal of colloid and interface science, 2005. 286(1): p. 90-100.

Valencia, A., Chang, N.-B., Wen, D., Ordonez, D. and Wanielista, M. P. (2019) Optimal Recipe Assessment of Iron Filing-Based Green Environmental Media for Improving Nutrient Removal in Stormwater Runoff. Environmental Engineering Science 36(10), 1323-1336.

Valencia, A., et al., Chemophysical Evaluation of Green Sorption Media for Copper Removal in Stormwater Runoff for Improving Ecosystem and Human Health. Water, Air, & Soil Pollution, 2019. 230(1): p. 2.

Vijayaraghavan, K., et al., Biosorption of nickel (II) ions onto Sargassum wightii: application of two-parameter and three-parameter isotherm models. Journal of hazardous materials, 2006. 133(1-3): p. 304-308.

Vippola, M., Ahmaniemi, S., Keränen, J., Vuoristo, P., Lepistö, T., Mäntylä, T., Olsson, E., 2002. Aluminum phosphate sealed alumina coating: characterization of microstructure. Materials Science Engineering: A 323, 1-8.

Vitousek, P. M., Aber, J. D., Howarth, R. W., Likens, G. E., Matson, P. A., Schindler, D. W., Schlesinger, W. H. and Tilman, D. G. (1997) Human alteration of the global nitrogen cycle: sources and consequences. Ecological Applications 7(3), 737-750.

Wen, D., Chang, N.-B. and Wanielista, M. P. (2018) Comparative copper toxicity impact and enzymatic cascade effect on Biosorption Activated Media and woodchips for nutrient removal in stormwater treatment. Chemosphere 213, 403-413.

Wolborska, A. (1989) Adsorption on activated carbon of p-nitrophenol from aqueous solution. Water Research 23(1), 85-91.

Xu, Z., Cai, J.-g. and Pan, B.-c. (2013) Mathematically modeling fixed-bed adsorption in aqueous systems. Journal of Zhejiang University Science A 14(3), 155-176.

Yan, G., Viraraghavan, T. and Chen, M. (2001) A new model for heavy metal removal in a biosorption column. Adsorption Science & Technology 19(1), 25-43.

Yang, Y.-Y. and Toor, G. S. (2017) Sources and mechanisms of nitrate and orthophosphate transport in urban stormwater runoff from residential catchments. Water Research 112, 176-184.

Zhao, B., Shang, Y., Xiao, W., Dou, C. and Han, R. (2014) Adsorption of Congo red from solution using cationic surfactant modified wheat straw in column model. Journal of Environmental Chemical Engineering 2(1), 40-45.

Zhao, Y., Yue, Q., Li, Q., Gao, B., Han, S. and Yu, H. (2010) The regeneration characteristics of various red mud granular adsorbents (RMGA) for phosphate removal using different desorption reagents. Journal of Hazardous Materials 182(1-3), 309-316.

All referenced publications are incorporated herein by reference in their entirety. Furthermore, where a definition or use of a term in a reference, which is incorporated by reference herein, is inconsistent or contrary to the definition of that term provided herein, the definition of that term provided herein applies and the definition of that term in the reference does not apply.

The advantages set forth above, and those made apparent from the foregoing description, are efficiently attained. Since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention that, as a matter of language, might be said to fall therebetween.

What is claimed is:

1. A filtration system for treating water containing nitrogen compounds and phosphorus compounds, the filtration system comprising:
    a media chamber including a homogenously mixed synergistic composition, the homogenously mixed synergistic composition including a mixture of iron filings of between 5 vol % and 7.5 vol %, clay particles of between 2 vol % and 3 vol %, and aluminum particles of between 2.5 vol % and 5 vol %,
    wherein the clay particles are configured to attract the nitrogen compounds and the phosphorus compounds to be absorbed onto a surface of the iron filings and the clay particles,
    wherein the aluminum particles are configured to react with nitrogen compounds via an oxidation reaction to form ammonia compounds, thereby synergistically removing the nitrogen compounds from the water within the media chamber, and
    wherein the aluminum particles react with the phosphorus compounds to produce aluminum phosphate, thereby synergistically removing the phosphorus compounds from the water within the media chamber.

2. The filtration system of claim 1, wherein the homogenously mixed synergistic composition further comprises sand particles of between 78 vol % and 85 vol %.

3. The filtration system of claim 1, wherein the aluminum particles are aluminum flakes.

4. The filtration system of claim 1, wherein the aluminum particles are aluminum powder.

5. The filtration system of claim 1, wherein the homogenously mixed synergistic composition further comprises an amount of tire crumb.

6. The filtration system of claim 5, wherein the amount of tire crumb is between 7.5 vol % and 10 vol %.

7. A method of treating water containing nitrogen compounds and phosphorus compounds, the method comprising the steps of:
   mixing together a homogenously mixed synergistic composition including iron filings of between 5 vol % and 7.5 vol %, clay particles of between 2 vol % and 3 vol %, and aluminum particles of between 2.5 vol % and 4.5 vol %;
   flowing water that contains nitrogen compounds and phosphorus compounds through the synergistic composition;
   attracting, via the clay particles, the nitrogen compounds and the phosphorus compounds;
   absorbing the nitrogen compounds and the phosphorus compounds onto a surface of the iron filings and the clay particles;
   via the aluminum particles, removing at least a portion of the nitrogen compounds via an oxidation reaction to form ammonia compounds; and
   via the aluminum particles, removing at least a portion of the phosphorus compounds to form aluminum phosphate,
   wherein the iron filings, the clay particles, and the aluminum particles act synergistically to remove the at least the portion of the nitrogen compounds and the phosphorus compounds from the water.

8. The method of claim 7, wherein the water is selected from the group consisting of stormwater runoff, wastewater effluent, agricultural discharge, and combinations thereof.

9. The method of claim 7, wherein the homogenously mixed synergistic composition further comprises sand particles of between 78 vol % and 85 vol %.

10. The method of claim 7, wherein the aluminum particles are aluminum flakes.

11. The method of claim 7, wherein the aluminum particles are aluminum powder.

12. The method of claim 7, wherein the homogenously mixed synergistic composition further comprises an amount of tire crumb.

13. The method of claim 12, wherein the amount of tire crumb is between 7.5 vol % and 10 vol %.

14. A filtration system for treating water containing nitrogen compounds and phosphorus compounds, the filtration system comprising:
   a media chamber including a homogenously mixed synergistic composition, the homogenously mixed synergistic composition including a mixture of iron filings of at least 5 vol %, clay particles of at least 2 vol %, aluminum particles of at least 2.5 vol %, and sand particles of at least 78 vol %,
   wherein the clay particles are configured to attract the nitrogen compounds and the phosphorus compounds to be absorbed onto a surface of the iron filings and the clay particles,
   wherein the aluminum particles are configured to react with nitrogen compounds via an oxidation reaction to form ammonia compounds, thereby synergistically removing the nitrogen compounds from the water within the media chamber, and
   wherein the aluminum particles react with the phosphorus compounds to produce aluminum phosphate, thereby synergistically removing the phosphorus compounds from the water within the media chamber.

15. The filtration system of claim 14, wherein the aluminum particles are aluminum flakes.

16. The filtration system of claim 14, wherein the aluminum particles are aluminum powder.

17. The filtration system of claim 14, wherein the homogenously mixed synergistic composition further comprises tire crumb of at least 7.5 vol %.

18. The filtration system of claim 14, wherein the iron filings are at most 7.5 vol %.

19. The filtration system of claim 14, wherein the clay particles are at most 3 vol %.

20. The filtration system of claim 14, wherein the aluminum particles are at most 5 vol %.

* * * * *